United States Patent
Oishi

(10) Patent No.: US 9,588,867 B2
(45) Date of Patent: Mar. 7, 2017

(54) INFORMATION PROCESSING DEVICE, METHOD FOR REPORTING REMAINING BATTERY CAPACITY, AND RECORDING MEDIUM

(71) Applicant: FUJITSU LIMITED, Kawasaki-shi, Kanagawa (JP)

(72) Inventor: Ryosuke Oishi, Kunitachi (JP)

(73) Assignee: FUJITSU LIMITED, Kawasaki (JP)

( * ) Notice: Subject to any disclaimer, the term of this patent is extended or adjusted under 35 U.S.C. 154(b) by 201 days.

(21) Appl. No.: 14/528,018

(22) Filed: Oct. 30, 2014

(65) Prior Publication Data
US 2015/0058617 A1 Feb. 26, 2015

Related U.S. Application Data

(63) Continuation of application No. PCT/JP2012/062213, filed on May 11, 2012.

(51) Int. Cl.
*G06F 1/32* (2006.01)
*G06F 11/34* (2006.01)
(Continued)

(52) U.S. Cl.
CPC ...... *G06F 11/3442* (2013.01); *G01R 31/3606* (2013.01); *G01R 31/3648* (2013.01);
(Continued)

(58) Field of Classification Search
CPC .................................................. G06F 9/45558
See application file for complete search history.

(56) References Cited

U.S. PATENT DOCUMENTS

| 2009/0010413 | A1 | 1/2009 | Abe |
| 2010/0023940 | A1 | 1/2010 | Iwamatsu et al. |
| 2014/0304542 | A1* | 10/2014 | Rogers ...................... G06F 1/28 713/340 |

FOREIGN PATENT DOCUMENTS

| JP | 2006-087228 | 3/2006 |
| JP | 2007-221228 | 8/2007 |

(Continued)

OTHER PUBLICATIONS

Mwaikambo et al., "Linux Kernel Hotplug CPU Support", Proceedings of the Linux Symposium, vol. Two, Jul. 2004 (16 pages).

(Continued)

*Primary Examiner* — Nitin Patel
(74) *Attorney, Agent, or Firm* — Fujitsu Patent Center

(57) ABSTRACT

An information processing device that is powered by a battery is provided. The information processing device includes a processor. The processor evaluates a virtual remaining capacity of the battery corresponding to each of a plurality of operating systems running on a hypervisor executed by the information processing device, by using characteristic information that indicates a characteristic of each of the plurality of operating systems and a physical remaining capacity value that indicates a physical remaining capacity of the battery. In addition, the processor reports, to each individual operating system of the plurality of operating systems, a virtual remaining capacity value obtained by evaluating the virtual remaining capacity of the battery corresponding to the individual operating system.

14 Claims, 14 Drawing Sheets

(51) Int. Cl.
  *G06F 9/50*   (2006.01)
  *G01R 31/36*  (2006.01)
  *G06F 9/455*  (2006.01)
  *G06F 11/30*  (2006.01)

(52) U.S. Cl.
  CPC ........ *G06F 1/3212* (2013.01); *G06F 9/45558* (2013.01); *G06F 9/5094* (2013.01); *G06F 11/3062* (2013.01); *G06F 11/3457* (2013.01); *G06F 2009/45591* (2013.01); *G06F 2201/815* (2013.01); *Y02B 60/1292* (2013.01); *Y02B 60/142* (2013.01)

(56) References Cited

FOREIGN PATENT DOCUMENTS

| | | |
|---|---|---|
| JP | 2008-234494 | 10/2008 |
| JP | 2009-111759 | 5/2009 |
| JP | 2010-33207 | 2/2010 |

OTHER PUBLICATIONS

International Search Report, mailed in connection with PCT/JP2012/062213 and mailed Aug. 7, 2012.

\* cited by examiner

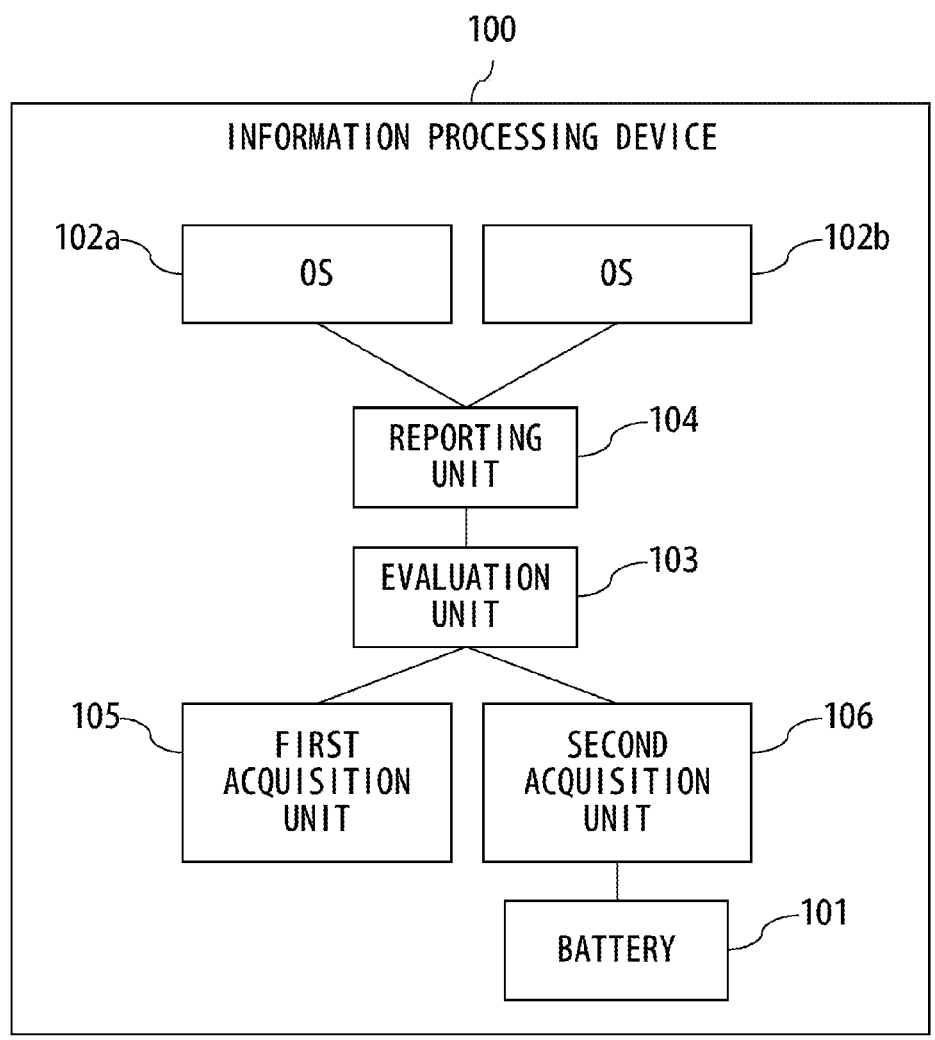
F I G. 1

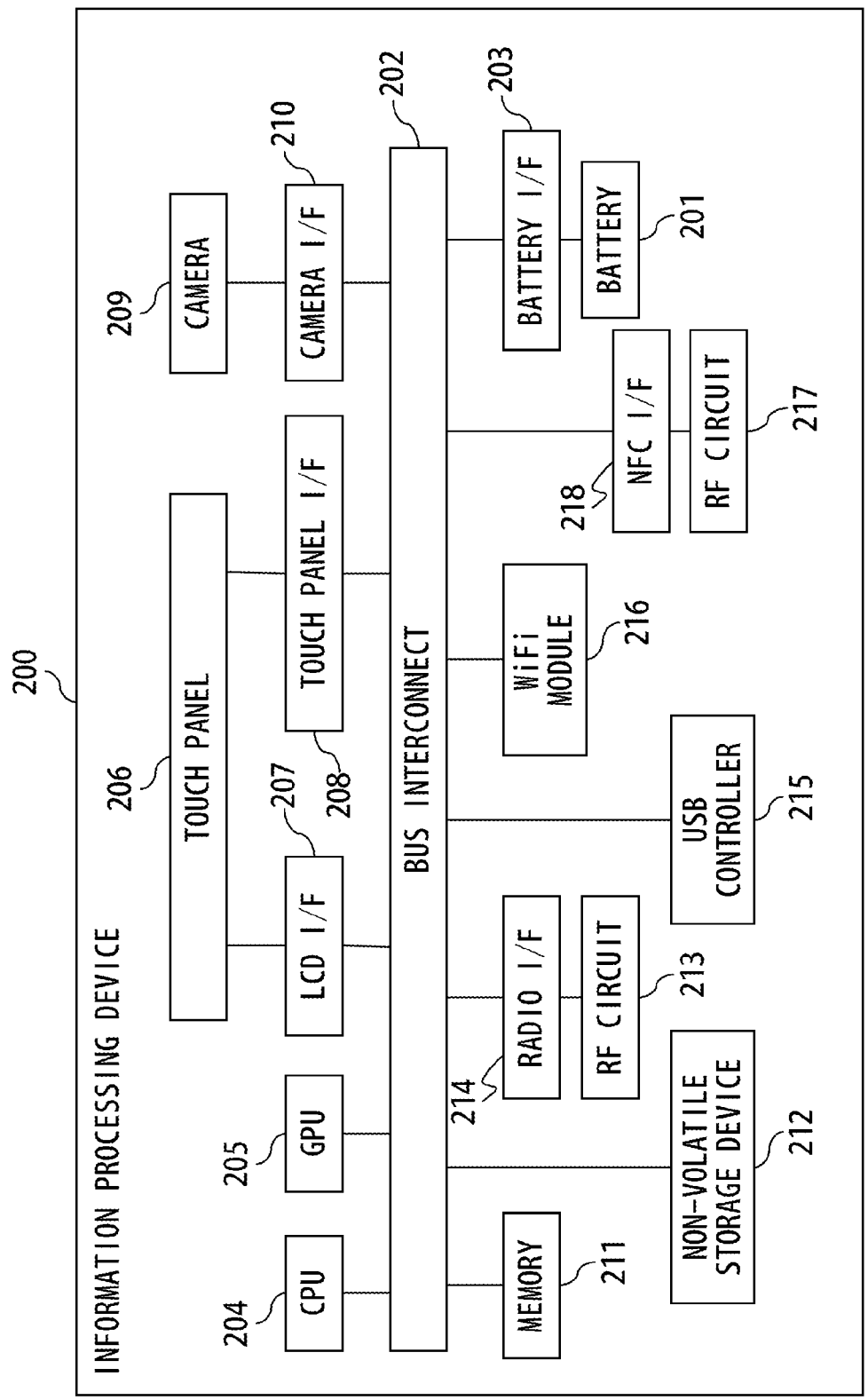
F I G. 2

PROFILE

| PRIORITY | 5 |
|---|---|
| MODE | THIRD MODE |

345 346

344

| | CPU USE RATE | CPU FREQUENCY | GPU | WiFi | ... |
|---|---|---|---|---|---|
| LAST TIME PERIOD | 50 % | 500 MHz | ON | 10 kB | ... |
| SECOND-TO-LAST TIME PERIOD | 20 % | 1 GHz | OFF | 25 kB | ... |
| ⋮ | ⋮ | ⋮ | ⋮ | ⋮ | ⋮ |
| $T^{th}$-TO-LAST TIME PERIOD | 60 % | 1 GHz | ON | 35 kB | ... |

401a

PROFILE

| PRIORITY | 2 |
|---|---|
| MODE | FIRST MODE |

345 346

344

| | CPU USE RATE | CPU FREQUENCY | GPU | WiFi | ... |
|---|---|---|---|---|---|
| LAST TIME PERIOD | 25 % | 500 MHz | ON | 0 kB | ... |
| SECOND-TO-LAST TIME PERIOD | 30 % | 500 MHz | ON | 20 kB | ... |
| ⋮ | ⋮ | ⋮ | ⋮ | ⋮ | ⋮ |
| $T^{th}$-TO-LAST TIME PERIOD | 15 % | 1 GHz | OFF | 15 kB | ... |

| | 500 OS | |
|---|---|---|
| | REMAINING BATTERY CAPACITY | APPLIED RULE |
| 501 | NOT LESS THAN 20 Wh | MAKE FIRST CORE OF CPU RUN AT 1GHz — 504 |
| | | MAKE SECOND CORE OF CPU RUN AT 500MHz — 505 |
| 502 | NOT LESS THAN 5 Wh BUT LESS THAN 20 Wh | MAKE FIRST CORE OF CPU RUN AT 500MHz — 506 |
| | | MAKE SECOND CORE OF CPU RUN AT 100MHz — 507 |
| | | LIMIT COMMUNICATION RATE TO 1kB/h — 508 |
| | | DISPLAY ALERT ON SCREEN — 509 |
| 503 | LESS THAN 5 Wh | FORCIBLY SLEEP — 510 |

| | 520 | |
|---|---|---|
| | REMAINING BATTERY CAPACITY | APPLIED RULE |
| 521 | NOT LESS THAN 25 Wh | MAKE FIRST CORE OF CPU RUN AT 1GHz — 524 |
| | | MAKE SECOND CORE OF CPU RUN AT 500MHz — 525 |
| 522 | NOT LESS THAN 2.5 Wh BUT LESS THAN 25 Wh | MAKE FIRST CORE OF CPU RUN AT 500MHz — 526 |
| | | MAKE SECOND CORE OF CPU RUN AT 100MHz — 527 |
| | | LIMIT COMMUNICATION RATE TO 1kB/h — 528 |
| | | DISPLAY ALERT ON SCREEN — 529 |
| 523 | LESS THAN 2.5 Wh | FORCIBLY SLEEP — 530 |

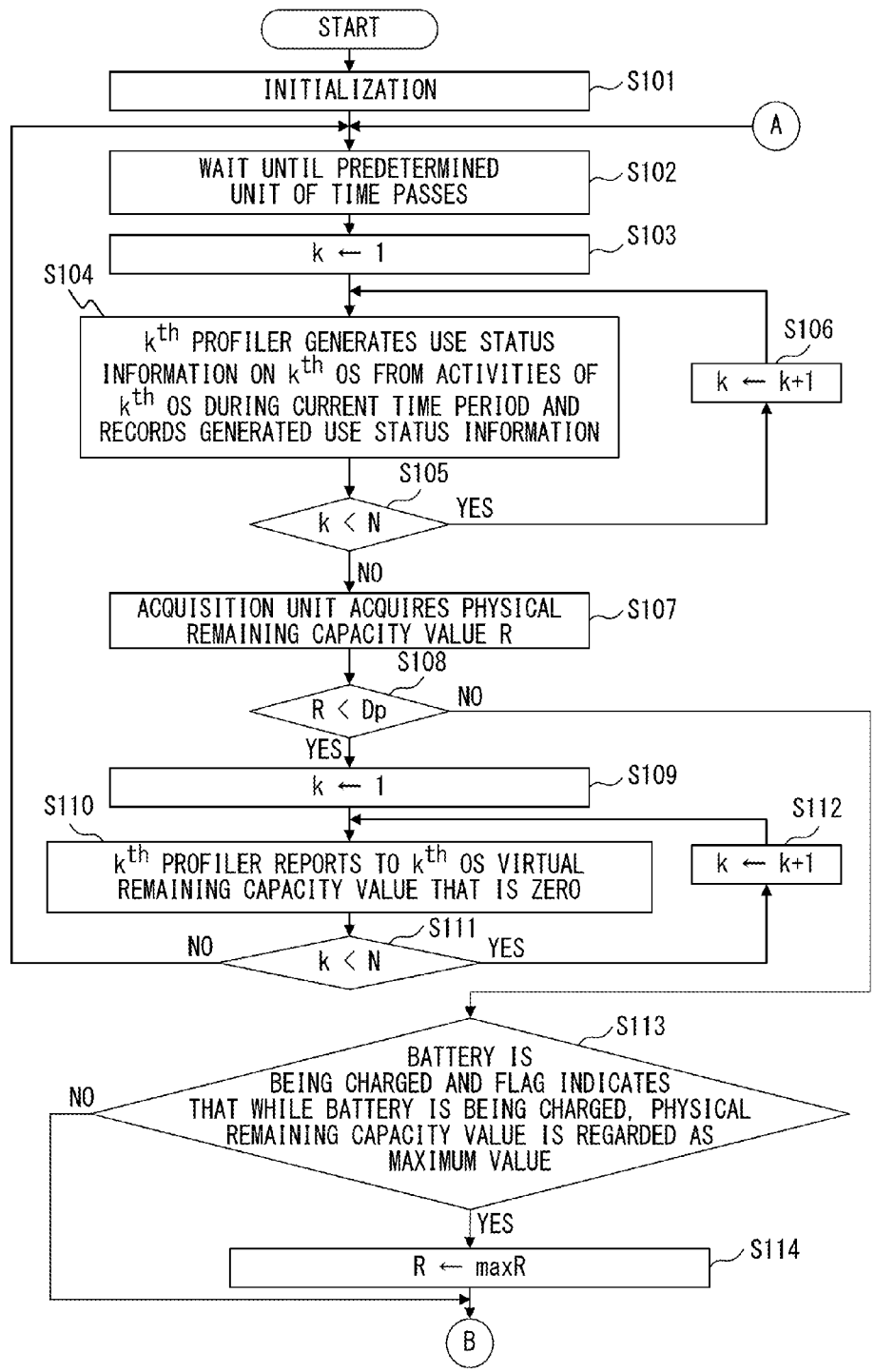
F I G. 6

| $t$ [h] | $R$ [Wh] | $c_1$ [W] | $c_2$ [W] | $c_L$ [W] |
|---|---|---|---|---|
| 0 | 100.00 | 13.50 | 13.00 | 4.00 |
| 1 | 69.50 | 13.50 | 13.00 | 4.00 |
| 2 | 39.00 | 13.50 | 13.00 | 4.00 |
| 3 | 8.50 | 2.61 | 3.00 | 1.00 |
| 4 | 1.89 | 0.00 | 2.00 | 1.00 |
| 5 | DEATH OF BATTERY | | | |

601

| $t$ [h] | $R$ [Wh] | $r_1$ [Wh] | $c_1$ [W] | $r_2$ [Wh] | $c_2$ [W] | $c_L$ [W] |
|---|---|---|---|---|---|---|
| 0 | 100.00 | 5.00 | 2.61 | 15.00 | 3.00 | 1.00 |
| 1 | 93.39 | 4.20 | 0.00 | 14.48 | 3.00 | 1.00 |
| 2 | 89.39 | 0.00 | 0.00 | 17.88 | 3.00 | 1.00 |
| 3 | 85.39 | 0.00 | 0.00 | 17.08 | 3.00 | 1.00 |
| 4 | 81.39 | 0.00 | 0.00 | 16.28 | 3.00 | 1.00 |
| 5 | 77.39 | 0.00 | 0.00 | 15.48 | 3.00 | 1.00 |
| 6 | 73.39 | 0.00 | 0.00 | 14.68 | 3.00 | 1.00 |
| 7 | 69.39 | 0.00 | 0.00 | 13.88 | 3.00 | 1.00 |
| 8 | 65.39 | 0.00 | 0.00 | 13.08 | 3.00 | 1.00 |
| 9 | 61.39 | 0.00 | 0.00 | 12.28 | 3.00 | 1.00 |
| 10 | 57.39 | 0.00 | 0.00 | 11.48 | 3.00 | 1.00 |
| 11 | 53.39 | 0.00 | 0.00 | 10.68 | 3.00 | 1.00 |
| 12 | 49.39 | 0.00 | 0.00 | 9.88 | 3.00 | 1.00 |
| 13 | 45.39 | 0.00 | 0.00 | 9.08 | 3.00 | 1.00 |
| 14 | 41.39 | 0.00 | 0.00 | 8.28 | 3.00 | 1.00 |
| 15 | 37.39 | 0.00 | 0.00 | 7.48 | 2.00 | 1.00 |
| ⋮ | ⋮ | ⋮ | ⋮ | ⋮ | ⋮ | ⋮ |

602

| $t$ [h] | $R$ [Wh] | $r_1$ [Wh] | $c_1$ [W] | $r_2$ [Wh] | $c_2$ [W] | $c_L$ [W] |
|---|---|---|---|---|---|---|
| 0 | 100.00 | 50.00 | 13.50 | 150.00 | 13.00 | 4.00 |
| 1 | 69.50 | 35.74 | 13.50 | 103.26 | 13.00 | 4.00 |
| 2 | 39.00 | 20.06 | 13.50 | 57.94 | 13.00 | 4.00 |
| 3 | 8.50 | 4.37 | 0.00 | 12.63 | 3.00 | 1.00 |
| 4 | 4.50 | 0.00 | 0.00 | 9.00 | 3.00 | 1.00 |
| 5 | 0.50 | 0.00 | 0.00 | 1.00 | 2.00 | 1.00 |
| 6 | DEATH OF BATTERY | | | | | |

603

F I G. 8

| $t$ [h] | $R$ [Wh] | $r_1$ [Wh] | $c_{1,j}$ [W] | $r_2$ [Wh] | $c_{2,j}$ [W] | $c_L$ [W] | 604 |
|---|---|---|---|---|---|---|---|
| 0 | 100.00 | 5.00 | 2.61 | 15.00 | 3.00 | 1.00 | |
| 1 | 93.39 | 4.20 | 0.00 | 14.48 | 3.00 | 1.00 | |
| 2 | 89.39 | 2.26 | 0.00 | 15.61 | 3.00 | 1.00 | |
| 3 | 85.39 | 0.00 | 0.00 | 17.08 | 3.00 | 1.00 | |
| 4 | 81.39 | 0.00 | 0.00 | 16.28 | 3.00 | 1.00 | |
| 5 | 77.39 | 0.00 | 0.00 | 15.48 | 3.00 | 1.00 | |
| 6 | 73.39 | 0.00 | 0.00 | 14.68 | 3.00 | 1.00 | |
| 7 | 69.39 | 0.00 | 0.00 | 13.88 | 3.00 | 1.00 | |
| 8 | 65.39 | 0.00 | 0.00 | 13.08 | 3.00 | 1.00 | |
| 9 | 61.39 | 0.00 | 0.00 | 12.28 | 3.00 | 1.00 | |
| 10 | 57.39 | 0.00 | 0.00 | 11.48 | 3.00 | 1.00 | |
| 11 | 53.39 | 0.00 | 0.00 | 10.68 | 3.00 | 1.00 | |
| 12 | 49.39 | 0.00 | 0.00 | 9.88 | 3.00 | 1.00 | |
| 13 | 45.39 | 0.00 | 0.00 | 9.08 | 3.00 | 1.00 | |
| 14 | 41.39 | 0.00 | 0.00 | 8.28 | 3.00 | 1.00 | |
| 15 | 37.39 | 0.00 | 0.00 | 7.48 | 2.00 | 1.00 | |
| 16 | 34.39 | 0.00 | 0.00 | 6.88 | 2.00 | 1.00 | |
| 17 | 31.39 | 0.00 | 0.00 | 6.28 | 2.00 | 1.00 | |
| 18 | 28.39 | 0.00 | 0.00 | 5.68 | 2.00 | 1.00 | |
| 19 | 25.39 | 0.00 | 0.00 | 5.08 | 2.00 | 1.00 | |
| 20 | 22.39 | 0.00 | 0.00 | 4.48 | 2.00 | 1.00 | |
| 21 | 19.39 | 0.00 | 0.00 | 3.88 | 2.00 | 1.00 | |
| ⋮ | ⋮ | ⋮ | ⋮ | ⋮ | ⋮ | ⋮ | |

| $t$ [h] | $R$ [Wh] | $r_1$ [Wh] | $c_{1,j}$ [W] | $r_2$ [Wh] | $c_{2,j}$ [W] | $c_L$ [W] | 605 |
|---|---|---|---|---|---|---|---|
| 0 | 100.00 | 50.00 | 13.50 | 150.00 | 13.00 | 4.00 | |
| 1 | 69.50 | 35.74 | 13.50 | 103.26 | 13.00 | 4.00 | |
| 2 | 39.00 | 20.06 | 13.50 | 57.94 | 13.00 | 4.00 | |
| 3 | 8.50 | 4.37 | 0.00 | 12.63 | 3.00 | 1.00 | |
| 4 | 4.50 | 1.98 | 0.00 | 7.02 | 2.00 | 1.00 | |
| 5 | 1.50 | 0.00 | 0.00 | 3.00 | 2.00 | 1.00 | |
| 6 | DEATH OF BATTERY ||||||| |

| REMAINING BATTERY CAPACITY | CPU | | GPU | | | | USB | WiFi | OTHERS |
|---|---|---|---|---|---|---|---|---|---|
| | FIRST CORE | SECOND CORE | FIRST CORE | SECOND CORE | THIRD CORE | FOURTH CORE | | | |
| NOT LESS THAN 30Wh | ○ | ○ | ○ | ○ | ○ | ○ | ○ | ○ | ○ |
| NOT LESS THAN 10Wh BUT LESS THAN 30Wh | ○ | ○ | ○ | ○ | ○ | ○ | × | ○ | ○ |
| NOT LESS THAN 1Wh BUT LESS THAN 10Wh | ○ | × | ○ | ○ | × | × | × | × | ○ |
| LESS THAN 1Wh | ○ | × | × | × | × | × | × | × | × |

702

| REMAINING BATTERY CAPACITY | CPU | | GPU | | | | USB | WiFi | OTHERS |
|---|---|---|---|---|---|---|---|---|---|
| | FIRST CORE | SECOND CORE | FIRST CORE | SECOND CORE | THIRD CORE | FOURTH CORE | | | |
| NOT LESS THAN 30Wh | ○ | ○ | ○ | ○ | ○ | ○ | ○ | ○ | ○ |
| NOT LESS THAN 10Wh BUT LESS THAN 30Wh | ○ | × | ○ | ○ | × | × | ○ | ○ | ○ |
| NOT LESS THAN 1Wh BUT LESS THAN 10Wh | ○ | × | ○ | × | × | × | ○ | ○ | ○ |
| LESS THAN 1Wh | ○ | × | × | × | × | × | × | × | × |

F I G. 10

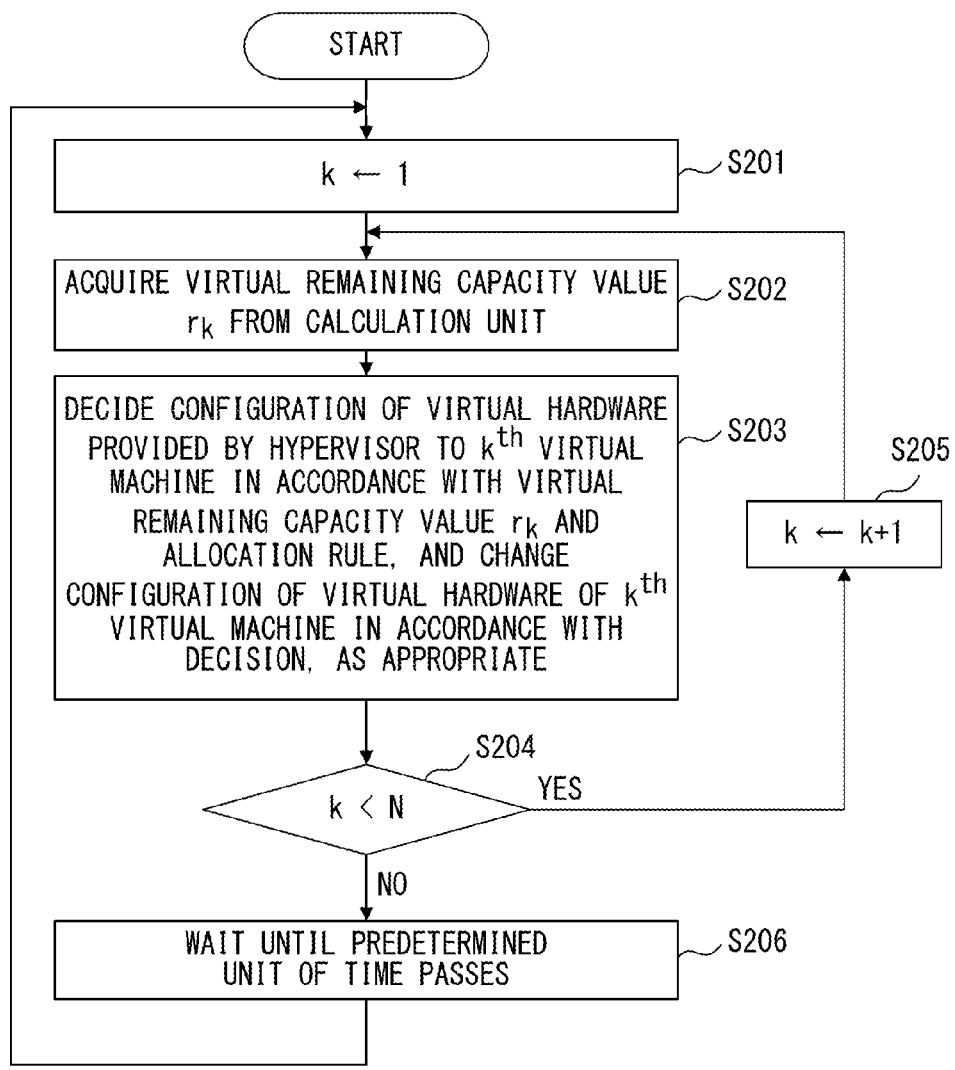
F I G. 11

801

| $t$ [h] | $R$ [Wh] | $u_1$ [%] | $w_1$ [kB/h] | $c_1$ [W] | $u_2$ [%] | $w_2$ [kB/h] | $c_2$ [W] |
|---|---|---|---|---|---|---|---|
| 0 | 100.00 | 50 | 65 | 9.65 | 25 | 100 | 9.50 |
| 1 | 80.85 | 50 | 65 | 9.65 | 25 | 100 | 9.50 |
| 2 | 61.70 | 50 | 65 | 9.65 | 25 | 100 | 9.50 |
| 3 | 42.55 | 50 | 65 | 9.65 | 25 | 100 | 9.50 |
| 4 | 23.40 | 50 | 65 | 9.65 | 25 | 100 | 9.50 |
| 5 | 4.25 | | | | | | |
| 6 | | | | DEATH OF BATTERY | | | |

802

| $t$ [h] | $R$ [Wh] | $u_1$ [%] | $w_1$ [kB/h] | $c_1$ [W] | $u_2$ [%] | $w_2$ [kB/h] | $c_2$ [W] |
|---|---|---|---|---|---|---|---|
| 0 | 100.00 | 50 | 65 | 9.65 | 25 | 100 | 9.50 |
| 1 | 80.85 | 50 | 65 | 9.65 | 25 | 100 | 9.50 |
| 2 | 61.70 | 50 | 65 | 9.65 | 25 | 100 | 9.50 |
| 3 | 42.55 | 50 | 65 | 9.65 | 25 | 100 | 9.50 |
| 4 | 23.40 | 50 | 0 | 9.65 | 25 | 100 | 5.25 |
| 5 | 8.50 | 50 | 0 | 4.50 | 25 | 100 | 3.25 |
| 6 | 0.75 | 50 | | 0.50 | 25 | 0 | 0.25 |
| 7 | | | | DEATH OF BATTERY | | | |

F I G. 1 3

INFORMATION PROCESSING DEVICE, METHOD FOR REPORTING REMAINING BATTERY CAPACITY, AND RECORDING MEDIUM

CROSS-REFERENCE TO RELATED APPLICATION

This application is a continuation application of International Application PCT/JP2012/062213 filed on May 11, 2012 and designated the U.S., the entire contents of which are incorporated herein by reference.

FIELD

The embodiments discussed herein relate to a battery-powered information processing device.

BACKGROUND

Various technologies have been developed for changing configurations or activities of an information processing device in accordance with conditions.

For example, there exists a technology of dynamically adding a device such as a CPU (a Central Processing Unit) or a memory to an information processing device, or dynamically deleting a device from an information processing device while the information processing device is running. Such a technology is called a "hot-plug". Dynamic addition or deletion of a device to and from the information processing device by using the hot-plug function is performed in accordance with a load of the information processing device in some cases or it is performed in accordance with a command input from a user in other cases.

The dynamic addition and deletion of the device by using the hot-plug function may also be called "hot-add" and "hot-remove", respectively. Although in some cases hot-add is called "hot-plug" and hot-remove is called "hot-unplug", a technology that includes hot-add and hot-remove is called "hot-plug" herein.

Further, in a battery-powered device, a control may sometimes be performed in accordance with a remaining battery capacity. For example, an operating system may sometimes control the power supply to the device or the operating frequency of the device, in accordance with a predetermined policy and remaining battery capacity.

With regard to the battery-powered device, suppressing electrical energy consumption leads to an improved convenience for a user. Accordingly, various technologies for suppressing the electrical energy consumption have been suggested.

Further, many of the battery-powered information processing devices have a function of displaying remaining battery capacity. Various suggestions have been made for a timing of updating the display of the remaining battery capacity or a method for displaying the remaining battery capacity more accurately.

For example, the following technology has been suggested for the information processing device that executes a plurality of programs.

The information processing device has a storage means, a detection means, an acquisition means, and an execution means. The storage means stores state information that is set by a first program and call-back information that is set by a second program by associating them with each other. The detection means detects a change in the state information set by the first program. The acquisition means acquires the call-back information set by the second program, when the detection means detects that the state of the first program has been changed. The execution means calls a call-back on the basis of the call-back information.

For example, the storage means may store information of a battery level as the state information, and may store a program that reports the battery level, as the call-back information. In this case, the execution means may report the battery level on the basis of the call-back information.

Further, various technologies have been suggested for suppressing the electrical energy consumption. For example, a battery may sometimes die because processing of terminating application software that is executed by a virtual machine function has been forgotten. For the purpose of preventing the dying of the battery as mentioned above, a mobile terminal as described below has been suggested.

A touch sensor unit is provided in the mobile terminal. The touch sensor unit is capable of sensing that the user touches the mobile terminal.

When a contact signal is output from the touch sensor unit to a control unit, it is determined that the mobile terminal is being used by the user. On the other hand, when a non-contact signal is output, it is determined that the mobile terminal is not being used at present.

When the non-contact signal is output from the touch sensor unit while the application software is being executed on the mobile terminal, the control unit suspends the execution of the application software that is being executed. With this suspension, the electrical energy consumption of the mobile terminal is suppressed.

Further, a virtual machine system as described below has also been suggested so as to suppress the electrical energy consumption of the virtual machine system for each virtual machine.

In the virtual machine system, a virtual battery management unit provides a virtual battery to a virtual machine. The virtual battery management unit sets an electrical energy consumption policy that indicates electrical energy consumption of the virtual machine system, an amount of charge policy that indicates an amount of charge in the virtual machine, and an electrical energy allocation table that indicates an allocated ratio of the electrical energy allocated to the virtual machine.

A schedule management unit allocates a resource to the virtual machine. In the virtual machine system, a resource quota for the virtual machine is acquired from a resource quota management unit.

When the virtual machine is in operation, processing of converting a CPU time into a discharged amount in reference to the electrical energy consumption policy and the electrical energy allocation table to reduce the remaining capacity of the virtual battery is performed. On the other hand, when the virtual machine is being stopped, processing of converting a stopping time into an amount of charge in reference to the amount of charge policy and the electrical energy allocation table to increase the remaining capacity of the virtual battery is performed.

Some documents as follows have been known.
Japanese Laid-open Patent Publication No. 2008-234494
Japanese Laid-open Patent Publication No. 2007-221228
Japanese Laid-open Patent Publication No. 2010-33207
Mwaikambo, Z., Raj, A., Russell, R., Schopp, J., and Vaddagiri, S., "Linux Kernel Hotplug CPU Support", Proceedings of the Linux Symposium, 2004, Vol. 2, pp. 467-480 (Linux is a registered trademark)

SUMMARY

According to an aspect of the embodiments, an information processing device that is powered by a battery is provided. The information processing device includes a processor. The processor evaluates a virtual remaining capacity of the battery corresponding to each of a plurality of operating systems running on a hypervisor executed by the information processing device, by using characteristic information that indicates a characteristic of each of the plurality of operating systems and a physical remaining capacity value that indicates a physical remaining capacity of the battery. In addition, the processor reports, to each individual operating system of the plurality of operating systems, a virtual remaining capacity value obtained by evaluating the virtual remaining capacity of the battery corresponding to the individual operating system.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a block configuration diagram of the information processing device in the first embodiment.

FIG. 2 illustrates an example of a hardware configuration of the information processing device.

FIG. 4 illustrates examples of profiles that are used in the second embodiment.

FIG. 5A and FIG. 5B illustrate examples of rule sets that are used in the second embodiment.

FIG. 6 and FIG. 7 illustrate a flowchart of processing that is performed by the information processing device in the second embodiment.

FIG. 8 illustrates examples of calculating virtual remaining capacity values by not using a history in the second embodiment.

FIG. 9 illustrates examples of calculating virtual remaining capacity values by using a history in the second embodiment.

FIG. 10 illustrates examples of allocation rules that are used in the third to fifth embodiments.

FIG. 11 illustrates a flowchart of processing that is performed by a hypervisor in the third embodiment.

FIG. 13 explains an effect of a dynamic configuration change of virtual hardware.

DESCRIPTION OF EMBODIMENTS

Figure 3:
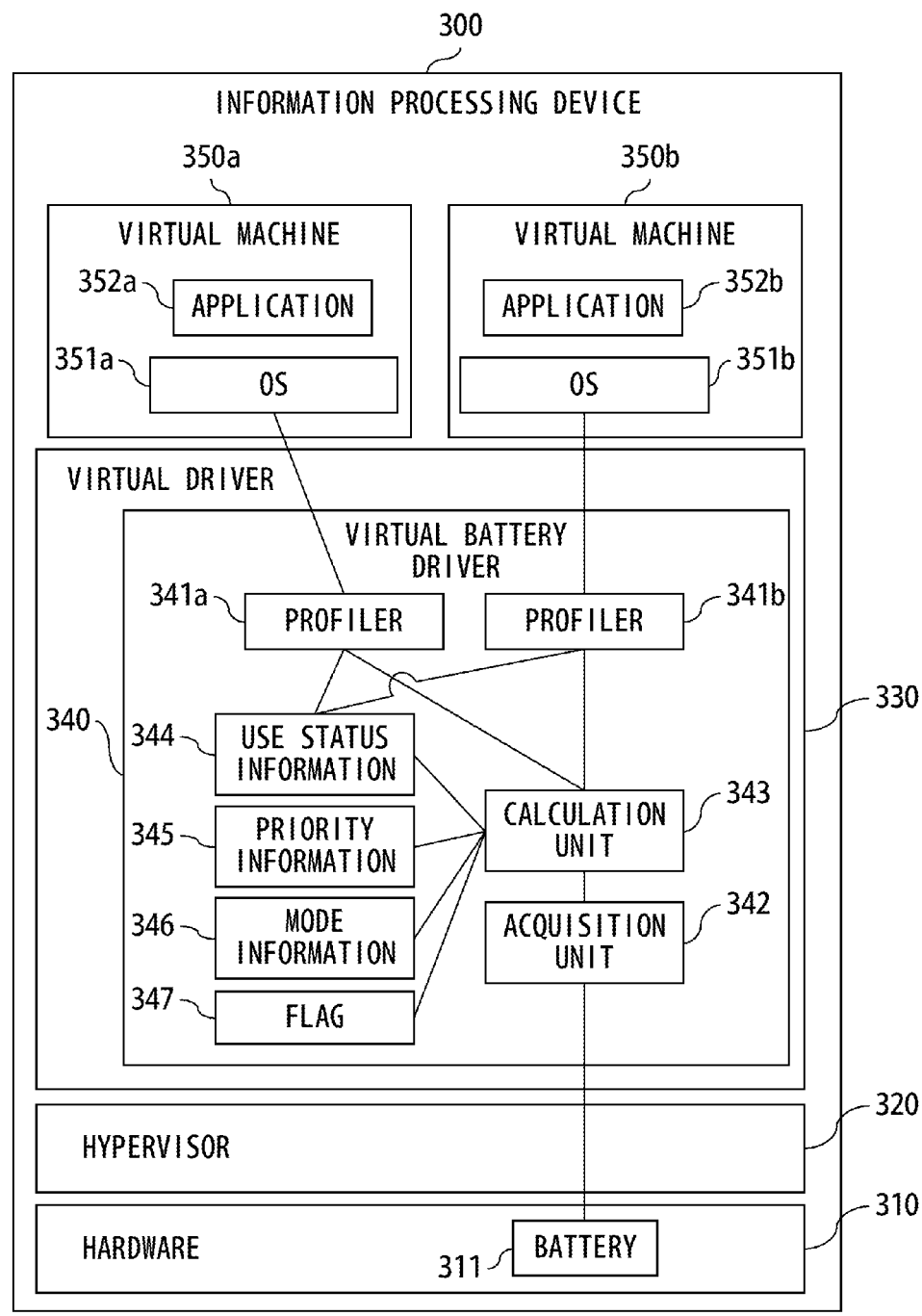
FIG. 3 is a block configuration diagram of the information processing device in the second embodiment.

A power supply management function for appropriately using the electrical energy according to the remaining battery capacity by following a certain policy is implemented in various operating systems.

Meanwhile, a plurality of operating systems may sometimes run on one information processing device. Specifically, a hypervisor may run on the information processing device, and a plurality of operating systems may run on the hypervisor. Under circumstances in which a plurality of operating systems may run on the hypervisor, the electrical energy may be used inappropriately for an information processing device as a whole when the individual operating systems independently perform a power supply management with each other.

One aspect of each of the embodiments explained as follows has an object that the electrical energy be appropriately used for an information processing device as a whole even when a plurality of operating systems run on a hypervisor. According to the information processing device in each of the following embodiments, the electrical energy is appropriately used for the information processing device as a whole even when a plurality of operating systems run on a hypervisor.

Hereinafter, detailed explanations for the embodiments are given in reference to the drawings. Specifically, first, explanations are given for the first embodiment in reference to FIG. 1. Next, explanations are given for an example of a hardware configuration of the information processing device to which all of the first to fifth embodiments are applicable, in reference to FIG. 2. After that, explanations are given for the second embodiment in reference to FIG. 3 to FIG. 9. Further, explanations are given for the third embodiment in reference to FIG. 10 to FIG. 11, for the fourth embodiment in reference to FIG. 10 and FIG. 12, and for the fifth embodiment in reference to FIG. 10 and FIG. 12. Explanations are further given for an effect of the third to fifth embodiments in reference to FIG. 13. Finally, explanations are also given for other modification examples.

FIG. 1 is a block configuration diagram of the information processing device in the first embodiment. The information processing device 100 of FIG. 1 is powered by a battery 101. The battery 101 may be a primary battery or a rechargeable secondary battery.

Specifically, the information processing device 100 powered by the battery 101 may be any type of (1a) to (1g) for example as follows.

(1a) a laptop PC (Personal Computer)
(1b) a tablet terminal
(1c) a PDA (Personal Digital Assistant)
(1d) a smartphone
(1e) a mobile phone
(1f) a mobile media player
(1g) any other type of mobile terminal The information processing device 100 is virtualized by using a hypervisor, and a plurality of operating systems run on the hypervisor (hereinafter the term "operating system" is abbreviated as "OS"). More specifically, the hypervisor runs on the information processing device 100, a plurality of virtual machines run on the hypervisor, and each OS runs on each of the virtual machines.

Although two OSs 102a and 102b are illustrated for example in FIG. 1, the number of the OSs (i.e., the number of virtual machines) may be arbitrarily determined in accordance with the embodiments. In FIG. 1, the virtual machines are omitted.

The information processing device 100 further includes an evaluation unit 103 and a reporting unit 104.

The evaluation unit 103 evaluates a virtual remaining capacity of the battery 101 corresponding to each of the plurality of the OSs (e.g., OSs 102a and 102b). The virtual remaining capacity of the battery 101 is, in other words, the virtual remaining charge of the battery 101. The value that is obtained by the evaluation performed by the evaluation unit 103 is hereinafter called "a virtual remaining capacity value". Specifically, the evaluation unit 103 evaluates each virtual remaining capacity value by using characteristic information that indicates a characteristic of each of the plurality of the OSs (e.g., OSs 102a and 102b) and a value that indicates a physical remaining capacity of the battery 101 (hereinafter this value is called a "physical remaining capacity value"). The physical remaining capacity of the battery 101 is, in other words, the physical remaining charge of the battery 101. From a certain point of view, the characteristic information is also information that indicates a characteristic of each virtual machine.

The reporting unit 104 reports to the OS 102a the virtual remaining capacity value obtained by the evaluation performed by the evaluation unit 103 corresponding to the OS 102a. The reporting unit 104 reports to the OS 102b the virtual remaining capacity value obtained by the evaluation performed by the evaluation unit 103 corresponding to the OS 102b.

The information processing device 100 may further include a first acquisition unit 105 and a second acquisition unit 106 for respectively acquiring the characteristic information and the physical remaining capacity value used by the evaluation unit 103 for evaluation.

The first acquisition unit 105 acquires the characteristic information that indicates the characteristics of each OS. The characteristic information may be statically predetermined information, dynamically changing information, or a combination of both.

In other words, the first acquisition unit 105 may read, from a storage device which is provided in the information processing device 100 but not illustrated in FIG. 1, static characteristic information stored in the storage device. With this, the first acquisition unit 105 may acquire the static characteristic information from the storage device.

Alternatively, the first acquisition unit 105 may generate dynamic characteristic information on the basis of actual activities of the OSs 102a and 102b (and those of applications that run on the OSs 102a and 102b). In other words, the first acquisition unit 105 may generate the dynamic characteristic information on the basis of actual activities of each of the virtual machines. With this, the first acquisition unit 105 may acquire the dynamic characteristic information.

The characteristic information of the OS 102a may include one or both of the two pieces of information that are indicated in the following (2a) and (2b), for example.

(2a) Use status information that indicates an amount of resources used by the OS 102a and by an application(s) that run(s) on the OS 102a.

(2b) Priority information that indicates a priority of the OS 102a.

Similarly to the above, the characteristic information of the OS 102b may include one or both of the two pieces of information that are indicated in the following (3a) and (3b).

(3a) Use status information that indicates an amount of resources used by the OS 102b and by an application(s) that run(s) on the OS 102b.

(3b) Priority information that indicates a priority of the OS 102b.

The use status information is an example of the dynamic characteristic information, and the priority information is an example of the static characteristic information.

Specifically, the resource for which the amount used is indicated by the use status information may be the electrical energy resource. For example, a value that indicates the electrical energy that is consumed during a certain time period or a value that indicates an estimated average power during the certain time period may be used as the use status information.

Alternatively, the resource for which the amount used is indicated by the use status information may be the hardware resource included in the information processing device 100 or the network resource that is available from the information processing device 100.

For example, the characteristic information that indicates the characteristics of the OS 102a with regard to the electrical energy consumption may include use status information that indicates how many of the hardware resources and network resources have been used by the OS 102a (and by an application(s) running on the OS 102a). The electrical energy consumed by the OS 102a (and by the application(s) running on the OS 102a) depends on the amount of the resources used by the OS 102a (and by the application (s) running on the OS 102a). Accordingly, the use status information as mentioned above indirectly indicates the characteristics of the OS 102a (in other words, the characteristics of the virtual machine on which the OS 102a runs) with regard to the electrical energy consumption.

The use status information may indicate how many of the resources have been used by each OS (and by an application(s) running on the OS concerned) in a particular time period (e.g., within the last one-minute period of time).

In another example, the information processing device 100 may store a history of the use status information in a storage unit that is not illustrated in FIG. 1. The evaluation unit 103 may use the history of the use status information in evaluating the virtual remaining capacity value. In other words, the characteristic information may include use status information that is associated with each of a plurality of time periods.

The second acquisition unit 106 acquires the physical remaining capacity value, which indicates the physical remaining capacity of the battery 101.

The evaluation unit 103 evaluates the virtual remaining capacity value that corresponds to each of the plurality of OSs, by using the characteristic information of each of the plurality of OSs and the physical remaining capacity value. In addition, the reporting unit 104 reports to each OS the virtual remaining capacity value, as mentioned above.

The evaluation unit 103 may calculate the virtual remaining capacity value from the characteristic information and the physical remaining capacity value in accordance with a predetermined formula. In other words, the evaluation unit 103 may evaluate the virtual remaining capacity value by calculation.

In another example, the characteristic information may be the information such as a conversion table that associates each of a plurality of virtual remaining capacity values with each of a plurality of physical remaining capacity values. In this case, the evaluation unit 103 may evaluate the virtual remaining capacity value by reading from the conversion table the virtual remaining capacity value that is associated with the physical remaining capacity value obtained from the second acquisition unit 106. As a matter of course, the evaluation unit 103 may evaluate the virtual remaining capacity value by using the conversion table and interpolation calculation.

When the virtual remaining capacity value is reported to the OS 102a, the OS 102a appropriately manages the power supply in accordance with the reported virtual remaining capacity value, following a predetermined policy for managing the power supply. For example, the OS 102a may issue a command to adjust a brightness of a display or may issue a command to adjust the clock frequency of a CPU. Specifically, these commands may be hypervisor calls.

The policy that is set in the OS 102a for managing the power supply may be any one of the following policies (4a) to (4c), for example.

(4a) A "power saving" policy for prolonging a service life of the battery 101 by reducing the performance to suppress the electrical energy consumption.

(4b) A "high performance" policy for improving the performance regardless of an increase in the electrical energy consumption.

(4c) A "balanced" policy that strikes a balance between both of the above mentioned policies.

Similarly, when the virtual remaining capacity value is reported to the OS 102b, the OS 102b appropriately executes a power-saving control in accordance with the reported virtual remaining capacity value, following a predetermined policy for managing the power supply (e.g., any one of the policies (4a) to (4c) may be employed).

Since the virtual remaining capacity value depends on the characteristic information, the virtual remaining capacity value that is reported to the OS 102a and the virtual remaining capacity value that is reported to the OS 102b are not necessarily the same.

In addition, the policies that are set in the OS 102a and the OS 102b are not necessarily the same. For example, there may be the following cases (5a) and (5b), for example.

(5a) A case in which while the OS 102a manages the power supply in accordance with the "power saving" policy, the OS 102b manages the power supply in accordance with the "high performance" policy.

(5b) A case in which even though both of the OSs 102a and 102b manage the power supply in accordance with the "power saving" policy, the value of the parameter that defines the "power saving" policy of the OS 102a and the value of the parameter that defines the "power saving" policy of the OS 102b are different.

Either way, the OSs 102a and 102b independently perform a control appropriately in accordance with the virtual remaining capacity values reported to the OSs 102a and 102b, respectively, following their own policies.

The details of the evaluation performed by the evaluation unit 103 may vary, in accordance with the policy for the power supply management of the information processing device 100 as a whole. The policy for the power supply management of the information processing device 100 as a whole is defined separately from each of the policies of the OSs 102a and 102b. The policy for the power supply management of the information processing device 100 as a whole may be any one of the following policies (6a) to (6c).

(6a) A policy that it is preferable to achieve a high performance for the information processing device 100 as a whole, which includes both OSs 102a and 102b.

(6b) A policy that it is preferable to prolong a service life of the battery 101.

(6c) A policy that strikes a balance between both of the above mentioned policies.

The evaluation unit 103 may calculate the virtual remaining capacity value of each OS in accordance with an appropriate formula that is determined by following the policy for managing the power supply for the information processing device 100 as a whole.

When the characteristic information includes the use status information, the virtual remaining capacity value may be defined such that the virtual remaining capacity value monotonically increases with respect to the resource use amount that is indicated by the use status information. When the characteristic information includes the priority information, the virtual remaining capacity value may be defined such that the virtual remaining capacity value monotonically increases with respect to the priority that is indicated by the priority information.

Further, under a specific condition, the evaluation unit 103 may evaluate (or re-evaluate) the virtual remaining capacity value by a method that is different from a method to be used when the specific condition does not hold true. Examples of the specific condition include the following conditions (7a) to (7c), for example.

(7a) A condition that the battery 101 is being charged.

(7b) A condition that the physical remaining capacity value is less than a threshold.

(7c) A condition that the virtual remaining capacity value obtained by the evaluation unit 103 is less than a threshold.

For example, when the battery 101 is being charged, the evaluation unit 103 may regard, for each of at least one of the plurality of OSs, the virtual remaining capacity value as being equal to the maximum value of the domain where the physical remaining capacity value varies. In other words, in this case, the reporting unit 104 reports to each of the at least one of the plurality of OSs the maximum value of the domain where the physical remaining capacity value varies, as the virtual remaining capacity value.

For example, the physical remaining capacity value may be given in units of Wh (Watt-hour). In this case, the maximum value of the domain of the physical remaining capacity value may be a value that is decided by the specifications of the battery 101 (specifically, a value that indicates the electrical energy that the battery 101 is capable of supplying from the fully charged state).

In another example, the physical remaining capacity value may be indicated by a percentage. In this case, the maximum value of the domain of the physical remaining capacity value is 100.

As mentioned above, when the battery 101 is being charged, the maximum value of the domain of the physical remaining capacity value may be reported as the virtual remaining capacity value regardless of the actual physical remaining capacity value.

For each individual OS of at least one of the plurality of OSs, the maximum value of the domain where the virtual remaining capacity value that corresponds to the individual OS varies may be defined. For example, when the characteristic information includes the priority information, the maximum value of the domain of the virtual remaining capacity value may be defined in accordance with the priority information and the maximum value of the domain of the physical remaining capacity value. When the battery 101 is being charged, if the maximum value of the domain of the virtual remaining capacity value is defined for a certain OS, the evaluation unit 103 may regard the virtual remaining capacity value that corresponds to the certain OS as the maximum value of the domain of the virtual remaining capacity value.

In yet another example, when the battery 101 is being charged, the evaluation unit 103 may regard the physical remaining capacity value as the maximum value of the domain where the physical remaining capacity value varies, regardless of the actual physical remaining capacity value. Then, the evaluation unit 103 may evaluate the virtual remaining capacity value that corresponds to each of the plurality of OSs by using the physical remaining capacity value regarded as the maximum value as mentioned above.

In yet another example, when the battery 101 is being charged, the evaluation unit 103 may regard the virtual remaining capacity value that corresponds to each of at least one of the plurality of OSs as equal to the physical remaining capacity value.

When the physical remaining capacity value is less than a first threshold, the evaluation unit 103 may regard the virtual remaining capacity value as zero, for each of at least one of the plurality of OSs. In other words, in this case, the reporting unit 104 reports to each of the at least one of the plurality of OSs that the virtual remaining capacity value is zero.

When the virtual remaining capacity value that corresponds to a certain OS from among the plurality of OSs is less than a second threshold, the evaluation unit 103 may re-evaluate the virtual remaining capacity value that corresponds to the certain OS as zero. In other words, in this case, the reporting unit 104 reports to the certain OS that the virtual remaining capacity value is zero.

The information processing device 100 may further include a display which is not illustrated in FIG. 1. The display displays a character, an image, or a combination thereof in accordance with the virtual remaining capacity value reported to at least one of the plurality of OSs. The display may display the virtual remaining capacity value with a character string such as, for example, "70%". As another example, the display may display an icon that indicates the virtual remaining capacity value in three levels, for example.

The operations of the information processing device 100 mentioned above may be realized as a processor included in the information processing device 100 executes a particular program. The particular program may be included in the program of the device driver for the battery 101, or may be included in the program of the hypervisor, for example. Specifically, the device driver for the battery 101 runs on the hypervisor.

According to the above explained information processing device 100 of FIG. 1, even when the plurality of OSs run on the hypervisor, the electrical energy is appropriately used for the information processing device 100 as a whole. Hereinafter, explanations are given for the advantage of the information processing device 100 through the comparison between two comparative examples (for convenience, they are called a "first comparative example" and a "second comparative example") and the information processing device 100 of FIG. 1.

In the first and second comparative examples, it is assumed that the hypervisor reports the same physical remaining capacity value to every OS. This assumption is in contrast to the first embodiment, in which the reporting unit 104 reports to each OS the virtual remaining capacity value for the OS concerned. Namely, no evaluation unit 103, no reporting unit 104, no first acquisition unit 105, or no second acquisition unit 106 exists in the first and second comparative examples.

In the meantime, none of the OSs recognizes whether the physical remaining capacity value is reported to the OS or whether the virtual remaining capacity value is reported to the OS. Accordingly, each of the OSs merely recognizes that the value that indicates the remaining capacity of the battery is reported, in the first embodiment of FIG. 1, and the first and second comparative examples.

None of the OSs is involved in the matter of which policy another OS depends on in managing the power supply. In other words, the plurality of OSs independently manages the power supply.

The policy of a certain OS and the policy of another OS may sometimes differ. In addition, even when similar policies are employed by the plurality of OSs, the parameter value that defines the policy of a certain OS may sometimes differ from the parameter value that defines the policy of another OS.

In the first comparative example and the first embodiment, the policy or parameter value may thus vary from one OS to another OS. On the other hand, in the second comparative example, it is assumed that all of the OSs manage the power supply, following exactly the same policy.

In the first comparative example, since the same physical remaining capacity value is reported to all of the OSs, the electrical energy may be inappropriately used for the information processing device 100 as a whole. For convenience of explanation, it is presupposed as the following (8a) to (8e).

(8a) Two of the OSs 102a and 102b run on the hypervisor in the first comparative example as well.

(8b) A policy that when the remaining capacity of the battery 101 is not less than 30%, the OS 102a runs in a normal mode, and when the remaining capacity of the battery 101 is less than 30%, the OS 102a runs in a power-saving mode is set in the OS 102a.

(8c) A policy that when the remaining capacity of the battery 101 is not less than 10%, the OS 102b runs in a normal mode, and when the remaining capacity of the battery 101 is less than 10%, the OS 102b runs in a power-saving mode is set in the OS 102b.

(8d) The normal mode is a mode in which the improved performance has priority over the suppression of electrical energy consumption.

(8e) The power-saving mode is a mode in which the suppression of electrical energy consumption has priority over the improved performance.

Under the presuppositions of (8a) to (8e) as mentioned above, let the physical remaining capacity value be 20%. In this case in the first comparative example, while the OS 102a runs in the power-saving mode, the OS 102b runs in the normal mode. When an OS running in the normal mode exists, the electrical energy consumption is relatively large. As a result, in the first comparative example, an event may happen wherein the battery 101 does not have a long service life as intended, even though the OS 102a runs in the power-saving mode, so as to prolong the service life of the battery 101.

As another example, under the presuppositions of (8a) to (8e), let the physical remaining capacity value be 50%. In this case in the first comparative example, the remaining battery capacity quickly decreases since both of the OSs 102a and 102b run in the normal mode.

Meanwhile, in order to manage the power supply, the OSs 102a and 102b may estimate (i.e., predict) the time period that will be taken for the remaining capacity of the battery 101 to reach 0%. In the first comparative example, the accuracy of this estimation may be unsatisfactory. For example, owing to the situation in which both of the OSs 102a and 102b run in the normal mode as mentioned above, an event may arise wherein the physical remaining capacity value becomes zero in a time period that is much shorter than the expected time period.

As mentioned above, in the first comparative example, there is a concern that the electrical energy may be inappropriately used for the information processing device 100 as a whole. Therefore, in order to avoid the problem in the first comparative example (i.e., the problem of the occurrence of unintended events, or of a low prediction accuracy), it may be possible to employ the second comparative example. However, the second comparative example is not particularly preferable.

The reason that the second comparative example is not particularly preferable is that flexible power supply management on an OS-by-OS basis is disabled since all of the OSs manage the power supply by following exactly the same policy. In other words, although one advantage of the virtualization by the hypervisor is independence of each of the OSs, flexible management on an OS-by-OS basis is inhibited in the second comparative example.

Further, not every OS has characteristics fitted to the policy that is common to all of the OSs. Some OSs may have a characteristic that is not fitted to the common policy. Therefore, in the second comparative example, the electrical energy may be inappropriately used for the information processing device 100 as a whole.

When compared with the above mentioned first and second comparative examples, the first embodiment has the following advantages (9a) and (9b).

(9a) So long as the evaluation unit 103 evaluates the virtual remaining capacity value following an appropriate policy (e.g., anyone of policies (6a) to (6c)), the electrical energy is appropriately used for the information processing device 100 as a whole.

(9b) The independence of each OS does not need to be sacrificed. In other words, flexible power supply management on an OS-by-OS basis is not limited.

The specific policies that are set for the plurality of OSs may be different from each other, as described above with reference to the policies of (4a) to (4c). However, many policies have the commonality that they attach more importance to improved performance when the remaining battery capacity is large than when the remaining battery capacity is small. In other words, many policies have the commonality that they attach more importance to the suppression of the electrical energy consumption when the remaining battery capacity is small than when the remaining battery capacity is large.

Therefore, in the first embodiment, the following features (10a) and (10b) may be expected if the evaluation unit 103 evaluates the virtual remaining capacity value in a manner in which the higher the priority of the OS is, the larger the virtual remaining capacity value is.

(10a) The OS that has high priority runs, attaching importance to improved performance.

(10b) The OS that has low priority runs, attaching importance to the suppression of the electrical energy consumption.

Therefore, the electrical energy is appropriately distributed among the OSs, in the information processing device 100 as a whole. In addition, flexibility may be maintained since unlike the second comparative example, in which every OS follow the same policy, each OS runs in accordance with a policy that is particular to the OS.

Further, in the first embodiment, the following features (11a) and (11b) may be expected if the evaluation unit 103 evaluates the virtual remaining capacity value in a manner in which the larger the load on the virtual machine is (i.e., the more the electrical energy consumed by the virtual machine is), the larger the virtual remaining capacity value for the OS running on the virtual machine is.

(11a) The OS running on the heavy-load virtual machine (i.e., the OS running on the virtual machine with a large electrical energy consumption) runs, attaching importance to improved performance.

(11b) The OS running on the virtual machine with the low load (i.e., the OS running on the virtual machine with a small electrical energy consumption) runs, attaching importance to the suppression of the electrical energy consumption.

Accordingly, it is preferable that the evaluation unit 103 evaluate highly the virtual remaining capacity value that corresponds to the OS on the virtual machine when the load of the virtual machine is high. The time period for which the OS of the heavy-load virtual machine recognizes that it is acceptable to attach importance to improved performance since it is found that the remaining battery capacity is sufficient may be prolonged as a result of such an evaluation, compared with the first comparative example, for example. In other words, when the virtual remaining capacity value monotonically increases with respect to the load, processes that are being executed on the OS of the heavy-load virtual machine may continue to be executed favorably without limitations for suppressing the electrical energy consumption (or with smaller limitations), and thereby a high performance is achieved.

It is preferable that the evaluation unit 103 relatively (i.e., not absolutely) evaluate a height of a load among a plurality of OSs (in other words, among a plurality of virtual machines) when it evaluates the virtual remaining capacity value in accordance with the height of the load, as mentioned above.

Next, in reference to FIG. 2, explanations are given for an example of a hardware configuration of the information processing device to which all of the first to fifth embodiments are applicable. The above mentioned information processing device 100 of FIG. 1 may be specifically realized by the information processing device 200 of FIG. 2. Similarly, the later mentioned information processing device 300 of FIG. 3 may be specifically realized by the information processing device 200 of FIG. 2. As a matter of course, an information processing device with a hardware configuration that is different from the hardware configuration of the information processing device 200 of FIG. 2 may be utilized.

The information processing device 200 of FIG. 2 is a mobile device that is powered by the battery 201. The battery 201 may be a primary battery or a rechargeable secondary battery. Specific examples of the information processing device 200 include a laptop PC, a tablet terminal, a PDA, a smartphone, a mobile phone, a mobile media player, and any other type of mobile terminal, for example.

The information processing device 200 includes some hardware components that are directly connected to a bus interconnect 202. The information processing device 200 also includes some hardware components that are indirectly connected to the bus interconnect 202 through an appropriate interface circuit (hereinafter abbreviated as an "I/F").

Specifically, the battery 201 is connected to the bus interconnect 202 through a battery I/F 203. The battery I/F 203 receives a request to acquire the physical remaining capacity value of the battery 201 and returns the physical remaining capacity value. The battery I/F 203 receives a command regarding an on/off control of the power supply from the battery 201 to another component and controls the power supply in accordance with the command. In FIG. 2, the power supply routes from the battery 201 to other components are omitted.

The information processing device 200 further includes a CPU 204 and a GPU (Graphics Processing Unit) 205 that are connected to the bus interconnect 202. Although only one CPU 204 is illustrated in FIG. 2, the information processing device 200 may include two or more CPUs. The CPU 204 may be a single-core CPU or a multi-core CPU.

Similarly, the information processing device 200 may include two or more GPUs 205. The GPU 205 may be a single-core GPU or a multi-core GPU. In some embodiments, instead of providing an independent GPU, the GPU 205 may be integrated into the CPU 204.

The information processing device 200 further includes a touch panel (i.e., touchscreen panel) 206. The touch panel 206 is an output device (i.e., a display) and is also an input device (i.e., a pointing device).

In the example of FIG. 2, the touch panel 206 is connected to the bus interconnect 202 through an LCD (Liquid Crystal Display) I/F 207 and a touch panel I/F 208. The LCD I/F 207 is an interface circuit for controlling the output to the touch panel 206 in accordance with a control signal from the CPU 204 or the GPU 205. The touch panel I/F 208 is an interface circuit for reporting to the CPU 204 the input from the touch panel 206.

The information processing device 200 further includes a camera 209, and the camera 209 is connected to the bus interconnect 202 through a camera I/F 210.

The information processing device 200 further includes a memory 211 and a non-volatile storage device 212 that are connected to the bus interconnect 202. The memory 211 may be a DRAM (Dynamic Random Access Memory), for example. The non-volatile storage device 212 may be a flash SSD (Solid-State Drive) or an HDD (Hard Disc Drive), for example. The memory 211 may be connected to the bus interconnect 202 through a memory controller. Further, the non-volatile storage device 212 has a built-in control circuit such as a disc controller, and the like.

The information processing device 200 further includes an RF (Radio Frequency) circuit 213, and the RF circuit 213 is connected to the bus interconnect 202 through a radio I/F 214. The RF circuit 213 may be a communication circuit in accordance with a communication standard such as 3GPP (Third Generation Partnership Project), LTE (Long Term Evolution), and WiMAX (Worldwide Interoperability for Microwave Access) (WiMAX is a registered trademark). The RF circuit 213 includes circuits such as an antenna, a modulator, a demodulator, and the like.

For example, the data generated by the CPU 204 or the data stored in the memory 211 may be output to the RF circuit 213 through the radio I/F 214 and transmitted from the RF circuit 213. When the RF circuit 213 receives a radio signal, the digital data indicated by the radio signal is output to another component (e.g., the CPU 204 or the memory 211) through the radio I/F 214 and the bus interconnect 202.

Further, a USB (Universal Serial Bus) controller 215 is connected to the bus interconnect 202. The information processing device 200 includes a not-illustrated USB port and the USB port and the USB controller 215 are connected by a bus in compliance with the USB standard. Accordingly, when another USB-compatible device (e.g., a memory card) is connected to the USB port, data may become transferable between the information processing device 200 and the USB-compatible device through the USB controller 215.

The information processing device 200 further includes a WiFi module 216 that is connected to the bus interconnect 202 ("WiFi" is a registered trademark). Although only one block of the WiFi module 216 is illustrated in FIG. 2, the WiFi module 216 may include two components, such as the RF circuit 213 and the radio I/F 214.

For example, the data generated by the CPU 204 or the data stored in the memory 211 may also be transmitted from the WiFi module 216 in an appropriate frame format. When the WiFi module 216 receives a frame, the data of the frame is output to the CPU 204 or the memory 211, for example.

The information processing device 200 further includes an RF circuit 217 for an NFC (Near Field Communication). The RF circuit 217 is connected to the bus interconnect 202 through an NFC I/F 218. The RF circuit 217 includes circuits of an antenna, a modulator, a demodulator, and the like.

For example, the data generated by the CPU 204 or the data stored in the memory 211 may be output to the RF circuit 217 through the NFC I/F 218 and transmitted from the RF circuit 217. When the RF circuit 217 receives a radio signal, the digital data indicated by the radio signal is output to another component (e.g., the CPU 204 or the memory 211) through the NFC I/F 218 and the bus interconnect 202.

In accordance with the embodiments, an information processing device with a hardware configuration that differs from the hardware configuration of the information processing device 200 of FIG. 2 may be utilized. For example, as an input device, instead of the touch panel 206 (or in addition to the touch panel 206), a mouse, a keyboard, a microphone, or any combination thereof may be used. Further, as an output device, instead of the touch panel 206, a normal display that does not have a touch sensor function may be used. As an output device, a speaker may further be used.

Further, the camera 209 may be omitted. The USB controller 215 and the USB bus may also be omitted.

In some types of the information processing device 200, the RF circuit 213 and the radio I/F 214 may be omitted. Alternatively, the WiFi module 216 may be omitted. Alternatively, the RF circuit 217 and the NFC I/F 218 may be omitted. Conversely, the information processing device 200 may further include a wired LAN (Local Area Network) module that is connected to the bus interconnect 202.

Specifically, the information processing device 100 of FIG. 1 may be the information processing device 200 of FIG. 2. In this case, various programs such as the following (12a) to (12f) are stored in the non-volatile storage device 212 beforehand, loaded into the memory 211, and then executed by the CPU 204. The CPU 204 also utilizes the memory 211 as a working area.

(12a) application programs.
(12b) The program of the OS 102a.
(12c) The program of the OS 102b.
(12d) The programs of the device drivers.
(12e) The program of the hypervisor (e.g., it may be the firmware program).
(12f) The specific program for making the CPU 204 serve as the evaluation unit 103, the reporting unit 104, the first acquisition unit 105, and the second acquisition unit 106 of FIG. 1.

The "specific program" of (12f) may be a part of the program of the device driver of (12d), or may be a part of the program of the hypervisor of (12e), for example.

The CPU 204 loads the specific program onto the memory 211 and executes the specific program of (12f). The CPU 204 serves as the evaluation unit 103, the reporting unit 104, the first acquisition unit 105, and the second acquisition unit 106 by executing the specific program of (12f).

The specific program of (12f) may be pre-installed in the information processing device 200, may be downloaded from a network, or may be copied from a recording medium (i.e., a storage medium). Specifically, the downloading may be performed through the RF circuit 213 and the radio I/F 214, or may be performed through the WiFi module 216. The recording medium may be a USB memory stick, for example.

In some embodiments, the information processing device 200 may include an optical disc drive. In such a case, the recording medium that stores the above mentioned specific program may be an optical disc. Examples of the optical disc include a CD (Compact Disc) or a DVD (Digital Versatile Disc).

As a matter of course, other types of recording media such as magnetic discs or a magneto-optical discs may be used. In accordance with the types of the recording media, the information processing device 200 may include an appropriate drive device or the information processing device 200 may be connected to an appropriate drive device through the USB port.

Explanations have been given for the memory 211, the non-volatile storage device 212, and various types of the recording media in the explanations of FIG. 2, and all of them are computer-readable tangible media. These tangible media are not transitory media such as signal carrier waves.

When the characteristic information that is acquired by the first acquisition unit 105 includes static information such as the priority information, the static characteristic information may be stored in the non-volatile storage device 212 of FIG. 2 beforehand. Then, the CPU 204 that serves as the first acquisition unit 105 may acquire the static characteristic information from the non-volatile storage device 212. The CPU 204 that serves as the first acquisition unit 105 may generate dynamic characteristic information by monitoring activities of the OSs 102a and 102b, thereby acquiring the characteristic information.

Specifically, the CPU 204 that serves as the second acquisition unit 106 may send to the battery I/F 203 through the bus interconnect 202 a request to acquire the physical remaining capacity value of the battery 201. Then, the CPU 204 acquires the physical remaining capacity value through the battery I/F 203.

Next, explanations are given for the second embodiment in reference to FIG. 3 to FIG. 9.

FIG. 3 is a block configuration diagram of the information processing device in the second embodiment. The information processing device 300 of FIG. 3 is virtualized as mentioned below.

The information processing device 300 has various types of hardware 310. One of the pieces of hardware 310 is the battery 311. In addition, the information processing device 300 may be realized by the information processing device 200 of FIG. 2. Namely, the hardware 310 may include the CPU 204, the GPU 205, the touch panel 206, the camera 209, the memory 211, the non-volatile storage device 212, the RF circuit 213, the USB controller 215, the WiFi module 216, the RF circuit 217, and the like.

The hypervisor 320 runs on the hardware 310. The hypervisor 320 is also called "a virtual machine monitor".

Virtual drivers 330 that correspond to multiple types of hardware 310 run on the hypervisor 320. One of the virtual drivers 330 is the virtual battery driver 340 that corresponds to the battery 311.

Further, a plurality of virtual machines is constructed on the information processing device 300. The virtual machine that runs on the hypervisor 320 is also called a "domain", a "logical domain", a "partition", or the like. In the example of FIG. 3, two virtual machines 350a and 350b run on the hypervisor 320.

The OS 351a runs in the virtual machine 350a, and one or more applications 352a run on the OS 351a. Similarly, the OS 351b runs in the virtual machine 350b, and one or more applications 352b run on the OS 351b.

When the information processing device 300 is realized by the information processing device 200, each of the following programs (13a) to (13d) is executed by the CPU 204 of FIG. 2.

(13a) The program of the hypervisor 320 (n.b., this program corresponds to the program of the above mentioned (12e)).

(13b) The programs of the virtual drivers 330, which include the virtual battery driver 340 (n.b., these programs correspond to the programs of the above mentioned (12d), and among these programs, the program of the virtual battery driver 340 corresponds to one of the programs of the above mentioned (12d) that includes the program of the above mentioned (12f)).

(13c) The programs of the OSs 351a and 351b (n.b., these programs correspond to the programs of the above mentioned (12b) and (12c)).

(13d) The programs of the applications 352a and 352b (n.b., these programs correspond to the programs of the above mentioned (12a)).

The programs of the above mentioned (13a) to (13d) may be stored in the non-volatile storage device 212 beforehand. Alternatively, the programs of the above mentioned (13a) to (13d) may be downloaded from the network through the RF circuit 213 and the radio I/F 214, or may be downloaded from the network through the WiFi module 216. The programs of the above mentioned (13a) to (13d) may be read from the computer readable recording medium and be copied to the non-volatile storage device 212. In all cases, the programs of (13a) to (13d) are loaded onto the memory 211 and are executed by the CPU 204.

The virtual battery driver 340 includes profilers 341a and 341b. The profiler 341a is associated with the OS 351a (in other words, the profiler 341a is associated with the virtual machine 350a). The profiler 341b is associated with the OS 351b (in other words, the profiler 341b is associated with the virtual machine 350b). The virtual battery driver 340 further includes the acquisition unit 342 and the calculation unit 343 as well.

The profilers 341a and 341b are similar to the first acquisition unit 105 of FIG. 1, and acquire a part of the characteristic information (more specifically, the use status information). Further, the profilers 341a and 341b are also similar to the reporting unit 104 of FIG. 1. Namely, the profilers 341a and 341b report to the OSs 351a and 351b the virtual remaining capacity value, respectively.

The acquisition unit 342 is similar to the second acquisition unit 106 of FIG. 1, and acquires the physical remaining capacity value of the battery 311. The calculation unit 343 is similar to the evaluation unit 103. Specifically, the calculation unit 343 calculates the virtual remaining capacity values from the characteristic information and the physical remaining capacity value, and outputs the calculated virtual remaining capacity values to the profilers 341a and 341b.

Further specific details of the above mentioned components in the virtual battery driver 340 are mentioned later together with flowcharts of FIG. 6 to FIG. 7.

FIG. 3 also illustrates various pieces of information which the calculation unit 343 uses for calculating the virtual remaining capacity values. Specifically, the use status information 344, the priority information 345, the mode information 346, and the flag 347 are illustrated in FIG. 3. The details of each piece of information are mentioned later together with FIG. 4, FIG. 6, and FIG. 7.

Next, in reference to FIG. 4, explanations are given for the specific examples of the use status information 344, the priority information 345, and the mode information 346 of FIG. 3. FIG. 4 illustrates examples of a profile that is used in the second embodiment.

The profile 401a of FIG. 4 includes the use status information 344, the priority information 345, and the mode information 346 that correspond to the OS 351a. Similarly, the profile 401b of FIG. 4 includes the use status information 344, the priority information 345, and the mode information 346 that correspond to the OS 351*b*. The profiles 401*a* and 401*b* are stored in an area that is a part of the physical memory 211 and is used by the virtual battery driver 340

According to the priority information 345 in the profile 401*a*, the priority of the OS 351*a* is "5". According to the mode information 346 in the profile 401*a*, the mode of the OS 351*a* is a "third mode".

On the other hand, according to the priority information 345 in the profile 401*b*, the priority of the OS 351*b* is "2". According to the mode information 346 in the profile 401*b*, the mode of the OS 351*b* is a "first mode".

Although the details of the mode are mentioned later together with FIG. 6 to FIG. 7, the mode indicated by the mode information 346 specifies the method in which the calculation unit 343 evaluates the virtual remaining capacity values when the battery 311 is being charged. In the second embodiment, it is assumed that three types of the modes, the "first mode" to the "third mode", are defined.

The priority information 345 and the mode information 346 is the predetermined static information. For example, the priority information 345 and the mode information 346 may be set in accordance with the input by the user. For example, the priority information 345 and the mode information 346 may be stored in the non-volatile storage device 212 beforehand, read by the virtual battery driver 340 from the non-volatile storage device 212, and loaded onto the memory 211.

Specifically, the use status information 344 in the profile 401*a* indicates, for each physical resource, the amount of the physical resource that has been used as a result of the activities of the OS 351*a* and the application 352*a* in each of the T time periods (where T≥1). Similarly, the use status information 344 in the profile 401*b* indicates, for each physical resource, the amount of the physical resource that has been used as a result of the activities of the OS 351*b* and the application 352*b* in each of the T time periods. For convenience of illustration, the use status information 344 is indicated in a table format in FIG. 4.

Each row of the table of the use status information 344 corresponds to one time period. The length of the time period is a predetermined constant.

Each column of the table of the use status information 344 corresponds to one observation item for one physical resource (specifically, one physical device). FIG. 4 illustrates an example of the use status information 344 in the case in which only one item is observed with regard to each of the GPU 205 and the WiFi module 216, while two items are observed with regard to the CPU 204 (or the core(s) in the CPU 204).

Due to space limitations, in FIG. 4, only the use status information 344 that corresponds to some of the physical devices is illustrated, and the use status information 344 that corresponds to the other physical devices is omitted. The use status information 344 in the profile 401*b* is indicated in the table format as well, similarly to the use status information 344 in the profile 401*a*.

A correspondence relationship between the physical device and the virtual device varies in accordance with the embodiments. The number of columns of the table of the use status information 344 may vary in accordance with the correspondence relationship.

As explained with regard to FIG. 2, for example, there may be one or more physical CPU and each of the physical CPUs may be a single-core CPU or a multi-core CPU. In addition, the number of the virtual CPUs of each virtual machine may be arbitrarily determined. The hypervisor 320 may provide to each of the virtual CPUs a single-core virtual CPU or a multi-core virtual CPU.

Therefore, a correspondence relationship between the physical CPU and the virtual CPU varies in accordance with the embodiments. To cite specific examples, for example, the following cases (14a) to (14f) may be considered. As a matter of course, different cases may also be considered. The case of the following (14e) may also be regarded as a more specific example of the case of (14a).

(14a) There is one physical CPU which is a single-core physical CPU or a multi-core physical CPU. The physical CPU is allocated (i.e., assigned) not only to the virtual CPU(s) of the virtual machine 350*a* but also to the virtual CPU(s) of the virtual machine 350*b*. In other words, the virtual machines 350*a* and 350*b* share the same physical CPU.

(14b) There are two physical CPUs, each of which is a single-core physical CPU or a multi-core physical CPU. A first physical CPU is allocated to the virtual CPU(s) of the virtual machine 350*a*. A second physical CPU is allocated to the virtual CPU(s) of the virtual machine 350*b*.

(14c) There are three physical CPUs, each of which is a single-core physical CPU or a multi-core physical CPU. First and second physical CPUs are allocated to the virtual CPU(s) of the virtual machine 350*a*. The hypervisor 320 may make the virtual machine 350*a* perceive there to be only one single-core CPU, or the hypervisor 320 may make the virtual machine 350*a* perceive there to be only one dual-core CPU. In the case of the latter, for example, The first physical CPU may be allocated to a first core of the virtual CPU, and the second physical CPU may be allocated to a second core of the virtual CPU. In addition, a third physical CPU is allocated to the virtual CPU(s) of the virtual machine 350*b*.

(14d) There is one dual-core physical CPU. A first core of the physical CPU is allocated to the virtual CPU(s) of the virtual machine 350*a*, and from the virtual machine 350*a*, the first core is perceived as one CPU. A second core of the physical CPU is allocated to the virtual CPU(s) of the virtual machine 350*b*, and from virtual machine 350*b*, the second core is perceived as one CPU.

(14e) There is one dual-core physical CPU. A first core of the physical CPU is allocated not only to a first core of the virtual CPU of the virtual machine 350*a* but also to a first core of the virtual CPU of the virtual machine 350*b*. In addition, a second core of the physical CPU is allocated not only to a second core of the virtual CPU of the virtual machine 350*a* but also to a second core of the virtual CPU of the virtual machine 350*b*.

(14f) There is one quad-core physical CPU. First and second cores of the physical CPU are respectively allocated to first and second cores of the virtual CPU of the virtual machine 350*a*. In other words, from the virtual machine 350*a*, there is perceived to be one dual-core CPU. In addition, third and fourth cores of the physical CPU are respectively allocated to first and second cores of the virtual CPU of the virtual machine 350*b*. In other words, from the virtual machine 350*b*, there is perceived to be one dual-core CPU.

As mentioned above, the correspondence relationship between the physical device and the virtual device varies in accordance with the embodiments, and the number of columns of the table of the use status information 344 may vary in accordance with the correspondence relationship. For example, in the cases of the above mentioned (14a) to (14f), the number of columns with regard to the CPU (or the CPU core) in the table of the use status information 344 is as follows.

In the case of the above mentioned (14a), there are two columns that respectively correspond to the use rate (i.e., utilization percentage) and the frequency of one physical CPU in the table of the use status information 344 of the profile 401a. Similarly, there are two columns that respectively correspond to the use rate and the frequency of one physical CPU in the table of the use status information 344 of the profile 401b.

In the case of the above mentioned (14b), there are two columns that respectively correspond to the use rate and the frequency of the first physical CPU in the table of the use status information 344 of the profile 401a. On the other hand, there are two columns that respectively correspond to the use rate and the frequency of the second physical CPU in the table of the use status information 344 of the profile 401b.

In the case of the above mentioned (14c), there are two columns that respectively correspond to the use rate and the frequency of the first physical CPU and two columns that respectively correspond to the use rate and the frequency of the second physical CPU in the table of the use status information 344 of the profile 401a. On the other hand, there are two columns that respectively correspond to the use rate and the frequency of the third physical CPU in the table of the use status information 344 of the profile 401b.

In the case of the above mentioned (14d), there are two columns that respectively correspond to the use rate and the frequency of the first core of the physical CPU in the table of the use status information 344 of the profile 401a. On the other hand, there are two columns that respectively correspond to the use rate and the frequency of the second core of the physical CPU in the table of the use status information 344 of the profile 401b.

In the case of the above mentioned (14e), there are two columns that respectively correspond to the use rate and the frequency of the first core of the physical CPU and two columns that respectively correspond to the use rate and the frequency of the second core of the physical CPU in the table of the use status information 344 of the profile 401a. Similarly, there are two columns that respectively correspond to the use rate and the frequency of the first core of the physical CPU and two columns that respectively correspond to the use rate and the frequency of the second core of the physical CPU in the table of the use status information 344 of the profile 401b.

In the case of the above mentioned (14f), there are two columns that respectively correspond to the use rate and the frequency of the first core of the physical CPU and two columns that respectively correspond to the use rate and the frequency of the second core of the physical CPU in the table of the use status information 344 of the profile 401a. On the other hand, there are two columns that respectively correspond to the use rate and the frequency of the third core of the physical CPU and two columns that respectively correspond to the use rate and the frequency of the fourth core of the physical CPU in the table of the use status information 344 of the profile 401b.

Accordingly, in the case of (14a), (14b), or (14d), for example, as illustrated in FIG. 4, one column of the use rate and one column of the frequency with regard to the CPU (or the CPU core) are provided in the table of the use status information 344 of each of the profiles 401a and 402b.

For example, the use status information 344 of the profile 401a indicates the following situations (15a) to (15d).

(15a) The CPU use rate due to the OS 351a and the application 352a is 50% during the last (i.e., latest) time period, 20% during the second-to-last time period, and 60% during the $T^{th}$-to-last time period. The "CPU use rate" here is the use rate (i.e., utilization percentage) of the physical CPU (or the physical CPU core) that is allocated to the virtual CPU (s) of the virtual machine 350a.

(15b) The clock frequency of the physical CPU (or the physical CPU core) that is allocated to the virtual CPU(s) of the virtual machine 350a is 500 MHz during the last time period, 1 GHz during the second-to-last time period, and 1 GHz during the $T^{th}$-to-last time period.

(15c) At least one of the OS 351a and the application 352a has used the virtual GPU of the virtual machine 350a during the last time period and the $T^{th}$-to-last time period. In other words, the physical GPU (specifically, the GPU 205) that is allocated to the virtual GPU of the virtual machine 350a has been used due to the activities of the OS 351a or the application 352a during the last time period and the $T^{th}$-to-last time period. However, the physical GPU has not been used as a result of the activities of the OS 351a or the application 352a during the second-to-last time period.

(15d) The sum of the volume of data received by the OS 351a and the application 352a through the virtual WiFi device during the last time period and the volume of data transmitted by the OS 351a and the application 352a through the virtual WiFi device during the last time period is 10 kB. In other words, the volume of data for the communication performed in association with the OS 351a and/or the application 352a through the physical WiFi device (specifically, the WiFi module 216) allocated to the virtual WiFi device of the virtual machine 350a is 10 kB during the last time period. In addition, the data volume during the second-to-last time period is 25 kB, and the data volume during the $T^{th}$-to-last time period is 35 kB.

The OS 351a may issue a hypervisor call to change the clock frequency of the physical CPU (or the physical CPU core) that is allocated to the virtual CPU(s) of the virtual machine 350a. However, it is the hypervisor 320 that decides whether or not to actually change the clock frequency of the physical CPU (or the physical CPU core). For example, when one physical CPU (or one physical CPU core) is shared by a plurality of virtual machines, the hypervisor 320 may decide not to change the clock frequency.

The hypervisor 320, when deciding to change the clock frequency, issues a command to change the clock frequency to the physical CPU (or the physical CPU core) in accordance with the decision. In the present embodiment, since the clock frequency is variable, the clock frequency is recorded as the use status information 344, as indicated in the above mentioned (15b).

Further, in FIG. 4, "ON" indicates that the physical GPU has been used during the time period and "OFF" indicates that the physical GPU has not been used during the time period.

Detailed explanations are omitted for the use status information 344 in the profile 401b, since it has a format that is similar to that of the use status information 344 in the profile 401a.

The use status information 344 in the profile 401a that has been explained so far above is generated by the profiler 341a and is recorded. For example, the profiler 341a may generate the use status information 344 in the profile 401a by monitoring the activities of the OS 351a. Then, the profiler 341a may store the generated use status information 344, for example, in the memory 211. As mentioned above, the profiler 341a may acquire the use status information 344 by monitoring and generation.

Similarly, the profiler 341b may generate the use status information 344 in the profile 401b by monitoring the activities of the OS 351b. Then, the profiler 341b may store the generated use status information 344, for example, in the memory 211.

More specifically, the profiler 341a may acquire the physical CPU use rate resulting from the activities of the virtual machine 350a through an inquiry to the hypervisor 320. In other words, the profiler 341a may acquire the ratio of the physical CPU time that has been consumed by the OS 351a and the application 352a to the total physical CPU time, for each physical CPU (or for each physical CPU core), through an inquiry to the hypervisor 320.

When the application 352a utilizes the device, the application 352a may invoke a system call. Then, the OS 351a may issue a command to the virtual driver 330 that corresponds to the device which the application 352a intends to use, in accordance with the system call. The virtual driver 330 may access the physical device by invoking a hypervisor call in accordance with the command from the OS 351a.

Namely, when the application 352a utilizes the device through the OS 351a, the virtual driver 330 may sometimes invoke the hypervisor call in accordance with the command from the OS 351a. As a matter of course, when the OS 351a utilizes the device, regardless of the application 352a, the virtual driver 330 may invoke a hypervisor call in accordance with a command from the OS 351a. Accordingly, the profiler 341a may generate the use status information 344 for each physical device as mentioned above by aggregating the hypervisor calls invoked from the virtual driver 330 in accordance with the commands from the OS 351a.

Even though the specific format of the hypervisor call may vary in accordance with the embodiments, the profiler 341a generates the use status information 344 in the profile 401a appropriately, in accordance with the format of the hypervisor call. For example, the profiler 341a may count the number of hypervisor calls for each type of the hypervisor calls, for each value of an argument of the hypervisor calls, or each combination of the type and the value of the argument.

Further, when a certain type of the hypervisor call takes a numerical argument, the profiler 341a may sum up the argument of the certain type of the hypervisor calls. The profiler 341a may acquire the numerical use status information 344 with the above mentioned summation. For example, the data volume of the above mentioned (15d) is an example of the numerical use status information 344.

Alternatively, in some architectures of the hypervisor 320, a device driver of a particular virtual machine may provide access to the hardware 310. Although in FIG. 3 the virtual driver 330 is illustrated outside of the virtual machines 350a and 350b for conveniences, when the virtual machine 350a is the above mentioned "particular virtual machine", for example, a device driver in the virtual machine 350a may provide access to the hardware 310.

In this case, in the virtual machine 350a, there may be a back end driver that serves as an interface with a device driver (i.e., a front end driver) in another virtual machine 350b and a real driver that actually accesses the hardware 310.

The front end driver in the virtual machine 350b is an interface for issuing the access request to the back end driver in the virtual machine 350a through the hypervisor 320.

For example, with regard to a certain type of a physical device, the profiler 341b may monitor requests from the front end driver in the virtual machine 350b to the back end driver in the virtual machine 350a. The profiler 341b, by counting the number of requests (or by appropriately performing aggregation processing in accordance with the type or the argument of the requests), may acquire the use status information 344 that corresponds to the virtual machine 350b.

The profiler 341a may monitor the access to the hardware 310 resulting from the activities of the OS 351a or the application 352a in the virtual machine 350a. Specifically, the profiler 341a may monitor the access to the hardware 310 performed by the real driver independent of the request from the front end driver in the virtual machine 350b. The profiler 341a, by counting the number of times of access (or by appropriately performing aggregation processing in accordance with the type or the argument of the access), may acquire the use status information 344 that corresponds to the virtual machine 350a.

The virtual battery driver 340 may be realized by a combination of the back end driver for the battery 311 and the real driver for the battery 311. For example, the acquisition unit 342, which acquires the physical remaining capacity value, may be included in the real driver. The profilers 341a and 341b may be included in the back end driver. In FIG. 3, although the profiler 341b and the OS 351b are connected by a line, when the profiler 341b is included in the back end driver that corresponds to the battery 311, the profiler 341b may report the virtual remaining capacity value to the OS 351b through the front end driver that corresponds to the battery 311 and that is included in the virtual machine 350b.

In some embodiments, the hypervisor may provide a function of responding to an inquiry with the use status information 344 for each combination of the physical device and the OS (or for each combination of the physical device and the virtual machine). In this case, the profiler 341a may acquire the use status information 344 in the profile 401a through the inquiry to the hypervisor 320. Similarly, the profiler 341b may acquire the use status information 344 in the profile 401b through the inquiry to the hypervisor 320.

As can be appreciated from the example of FIG. 4, the specific format of the use status information 344 may differ for each physical device.

The use status information 344 of the CPU 204 (or a core of the CPU 204) is indicated by a percentage and a frequency. In some embodiments, the use status information 344 of the GPU 205 (or a core of the GPU 205) may be indicated by a percentage and a frequency as well. However, in the example of FIG. 4, the use status information 344 of the GPU 205 is indicated as "ON" and "OFF" in a binary manner. The use status information 344 of the WiFi module 216 is numerically indicated by the data volume (e.g., a volume in units of kilobytes in the example of FIG. 4).

The use status information 344 concerning the input from the touch panel 206 may also be indicated in a binary manner. For example, when the user touches the display area that corresponds to the OS 351a or the application 352a at least once during the time period concerned, the value of the use status information 344 concerning the input from the touch panel 206 in the profile 401a is "ON". On the other hand, when the user has not touched the above mentioned display area during the time period concerned, the value of the use status information 344 is "OFF".

In some embodiments, the use status information 344 concerning the input from the touch panel 206 may also be indicated numerically. For example, the volume of data that has been output to the bus interconnect 202 through the touch panel I/F 208 from the touch panel 206 is available as the numerical use status information 344. The profiler 341a may calculate the data volume on the basis of the number of interruptions issued to the OS 351a from the virtual driver 330 corresponding to the input from the touch panel 206, or on the basis of the arguments of such interruptions.

Further, the use status information 344 concerning the output from the touch panel 206 may also be indicated numerically. Specifically, the use status information 344 concerning the output of the touch panel 206 may be indicated by the volume of data that has been output to the VRAM (Video Random Access Memory) during the time period concerned. For example, the profiler 341a may calculate the data volume on the basis of the argument of the hypervisor calls that are issued, in response to the commands from the OS 351a, by the virtual driver 330 that corresponds to the output to the touch panel 206.

Similarly, the use status information 344 concerning the USB controller 215 may be indicated either in a binary manner or numerically. In other words, the use status information 344 may indicate whether or not the USB device has been used through the USB controller 215, or may indicate the volume of data that has been transferred through the USB controller 215.

The use status information 344 concerning the camera 209 may be indicated numerically by the data volume of the image(s) captured by the camera 209, for example. When the information processing device 200 has a speaker, the use status information 344 concerning the speaker may be indicated numerically by the volume of the audio data output to the speaker. In some embodiments, the use status information 344 concerning the camera 209 or the speaker may be indicated in a binary manner.

The use status information 344 of the RF circuit 213 may be indicated numerically by the volume of the data that has been communicated by the RF circuit 213, similarly to the use status information 344 of the WiFi module 216. Similarly, the use status information 344 of the RF circuit 217 may also be indicated numerically.

For some types of the devices, the use status information 344 may be indicated in an n-ary manner (where n>2) instead of being indicated numerically or in a binary manner.

As mentioned so far above, the format of the use status information 344 varies. However, regardless of the format of the use status information 344, the profiler 341a is capable of acquiring the use status information 344 of the profile 401a by appropriately performing monitoring or inquiries in accordance with the types of the physical devices. Similarly, the profiler 341b is capable of acquiring the use status information 344 of the profile 401b regardless of the format of the use status information 344.

For example, it is the hypervisor 320 that decides whether or not the clock frequency of the physical CPU (or the physical CPU core) is to be actually changed. Accordingly, when the OS 351a issues the hypervisor call that requests to change the clock frequency, the profiler 341a may inquire of the hypervisor 320 about the actual clock frequency.

Figure 5B:
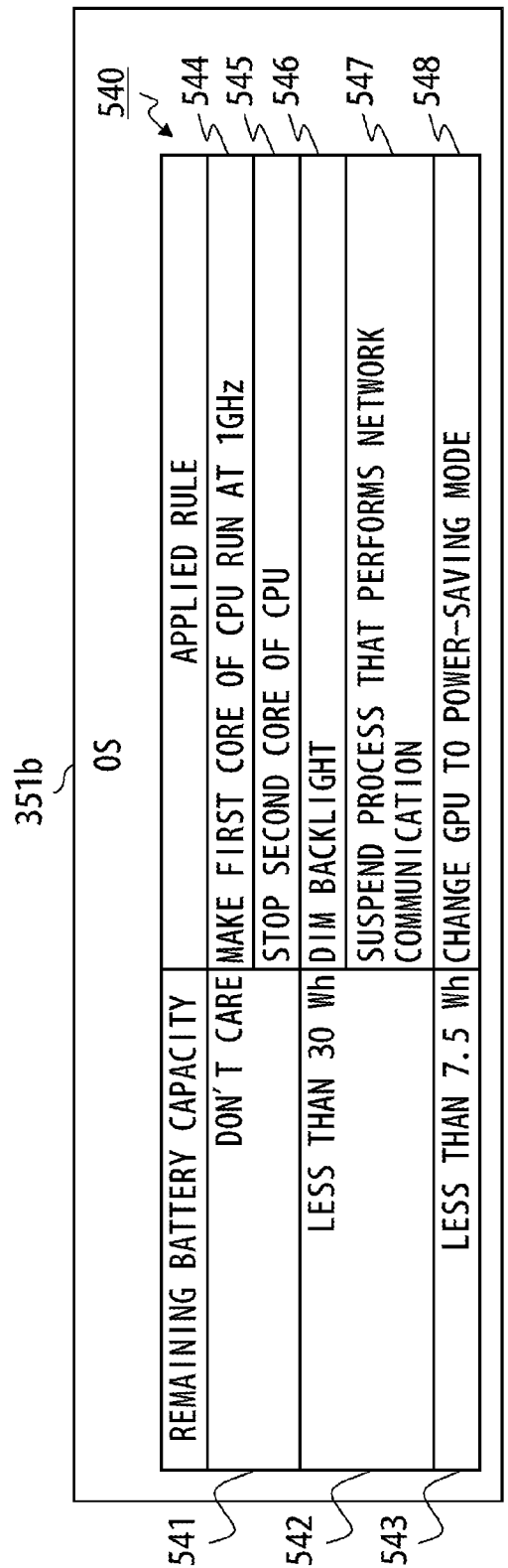

In the meantime, the OSs 351a and 351b run independently of each other in accordance with each of the policies concerning the power supply management. In the second embodiment, the policy concerning the power supply management is specifically indicated by a rule set that includes a plurality of rules. FIGS. 5A and 5B illustrates examples of the rule sets that are used in the second embodiment.

In the example of FIGS. 5A and 5B, two rule sets 500 and 520 are predefined in the OS 351a, and one rule set 540 is predefined in the OS 351b. In the OS in which the plurality of the rule sets are defined, one of the plurality of the rule sets is selectable. For example, in the OS 351a, rule set 500 may be selected in accordance with the input from the user.

Each rule set includes a plurality of rules. Each rule is associated with the condition concerning the remaining capacity value (i.e., the virtual remaining capacity value) of the battery 311 recognized by the OS. The correspondence between the condition and the rule indicates that when the condition is satisfied, the OS applies the rule.

For example, three conditions 501 to 503 are defined in rule set 500, and rule set 500 includes seven rules 504 to 510. Each of rules 504 to 510 is associated with one of the conditions 501 to 503. In the following, for ease of explanation, it is assumed that the remaining capacity value of the battery is indicated in units of Wh (i.e., it is indicated by the available remaining electrical energy).

The condition 501 is a condition in which the value recognized by the OS 351a as the remaining capacity of the battery 311 (i.e., the virtual remaining capacity value reported to the OS 351a) is not less than 20 Wh. The condition 502 is a condition in which the value recognized by the OS 351a as the remaining capacity of the battery 311 is not less than 5 Wh but less than 20 Wh. The condition 503 is a condition in which the value recognized by the OS 351a as the remaining capacity of the battery 311 is less than 5 Wh.

In the following, for ease of explanation, it is assumed that the number of cores of the CPU (i.e., the virtual CPU) recognized by the OS 351a as a result of the virtualization by the hypervisor 320 is 2. Similarly, it is assumed that the number of cores of the CPU recognized by the OS 351b is also 2. For example, in the case of the above mentioned (14e) and (14f), in both cases, the number of cores of the virtual CPU recognized by the OS 351a is 2, and the number of cores of the virtual CPU recognized by the OS 351b is 2.

In rule set 500, a rule 504 is associated with the condition 501. The rule 504 is a rule for making the first core run at 1 GHz in the two virtual CPU cores that are recognized by the OS 351a.

The rule 505 is also associated with the condition 501. Rule 505 is a rule for making the second core run at 500 MHz in the two virtual CPU cores that are recognized by the OS 351a.

When a virtual remaining capacity value of not less than 20 Wh is reported to the OS 351a, the OS 351a applies rules 504 and 505. Specifically, the OS 351a issues a command to make the first core of the virtual CPU run at 1 GHz and issues a command to make the second core of the virtual CPU run at 500 MHz. These commands may specifically be the hypervisor calls.

The hypervisor 320 may change the clock frequency of the physical CPU core in accordance with the hypervisor call from the OS 351a, or may let the clock frequency of the physical CPU core be unchanged even if the hypervisor call is invoked from the OS 351a. For example, the hypervisor 320 may adjust the allocation to the OS 351a of the physical CPU time in accordance with the hypervisor call invoked from the OS 351a so as to avoid changing the clock frequency itself of the physical CPU core.

All of rules 506 to 509 are associated with the condition 502. Accordingly, when a virtual remaining capacity value of not less than 5 Wh but less than 20 Wh is reported, the OS 351a applies rules 506 to 509.

The rule 506 is a rule that makes the first core run at 500 MHz. The rule 507 is a rule that makes the second core run at 100 MHz. The rule 508 is a rule that limits the data rate of the communication through the WiFi module to 1 kB/h. The rule 509 is a rule that displays an alert on a screen.

Further, a rule 510 is associated with the condition 503. The rule 510 is a "forcible sleep" rule. Accordingly, when a virtual remaining capacity value that is less than 5 Wh is reported to the OS 351a, the OS 351a makes the application 352a sleep and the OS 351a itself sleeps as well.

In rule set 520, three rules 521 to 523 are defined. A condition 521 is a condition in which the value recognized by the OS 351a as the remaining capacity of the battery 311 (i.e., the virtual remaining capacity value reported to the OS 351a) is not less than 25 Wh. A condition 522 is a condition in which the value recognized by the OS 351a as the remaining capacity of the battery 311 is not less than 2.5 Wh but less than 25 Wh. A condition 523 is a condition in which the value recognized by the OS 351a as the remaining capacity of the battery 311 is less than 2.5 Wh.

Rules 524 and 525 are associated with the condition 521, and rules 526 to 529 are associated with the condition 522, and a rule 530 is associated with the condition 523. The rules 524 to 530 are respectively the same as the rules 504 to 510. Namely, although the same rules are included in rule sets 500 and 520, the condition to which each of the rules is applied differs between rule sets 500 and 520.

For example, when a virtual remaining capacity value of 22 Wh is reported to the OS 351a, if rule set 500 is selected, the OS 351a applies rules 504 and 505. However, if rule set 520 is selected, the OS 351a applies rules 526 to 529.

In the meantime, one rule set 540 is defined in the OS 351b, and the OS 351b operates in accordance with rule set 540. In rule set 540, three conditions 541 to 543 are defined, and rule set 540 includes five rules 544 to 548.

The condition 541 is a condition that indicates "Don't care". Namely, regardless of the value recognized by the OS 351b as the remaining capacity of the battery 311 (i.e., the virtual remaining capacity value reported to the OS 351b), the condition 541 is always regarded as "satisfied". The condition 542 is a condition in which the value recognized by the OS 351b as the remaining capacity of the battery 311 is less than 30 Wh. The condition 543 is a condition in which the value recognized by the OS 351b as the remaining capacity of the battery 311 is less than 7.5 Wh.

The rule 544 is associated with the condition 541. The rule 544 is a rule for making the first core run at 1 GHz in the two virtual CPU cores that are recognized by the OS 351b.

The rule 545 is also associated with the condition 541. The rule 545 is a rule for stopping the second core in the two virtual CPU cores that are recognized by the OS 351b.

When applying rule 544, specifically, the OS 351b may invoke the hypervisor call for making the first core run at 1 GHz. Similarly, when applying rule 545, specifically, the OS 351b may invoke the hypervisor call for stopping the second core.

Whether the hypervisor 320 actually changes the clock frequency of the physical CPU core or not depends on the situation. Similarly, whether the hypervisor 320 actually stops the physical CPU core in accordance with the hypervisor call or not depends on the situation.

The rule 546 is associated with the condition 542. The rule 546 is a rule for dimming a backlight of the display.

The OS 351b does not recognize the physical device of the touch panel 206 itself but recognizes the virtual display that corresponds to the touch panel 206. Accordingly, when applying rule 546, the OS 351b may issue a command to dim the backlight of the display to the virtual display driver from among the virtual drivers 330. Whether the backlight of the touch panel 206 is actually dimmed in accordance with the command issued from the OS 351b or not depends on the situation.

The rule 547 is also associated with the condition 542. The rule 547 is a rule for suspending the process that performs a network communication. For example, the OS 351b may monitor the system calls invoked from user processes for performing the network communication in order to judge which process performs the network communication.

The rule 548 is associated with the condition 543. The rule 548 is a rule for changing the GPU to a power-saving mode. When applying rule 548, the OS 351b issues a command to change the virtual GPU that corresponds to the GPU 205, which is the physical device, to a power-saving mode. The command may specifically be the hypervisor call.

For example, when a virtual remaining capacity value of 10 Wh is reported to the OS 351b, both of the conditions 541 and 542 are satisfied. Accordingly, in this case, the OS 351b applies rules 544 to 547.

Next, explanations are given for processing that is performed by the information processing device 300 of FIG. 3. While the information processing device 300 is powered on, the following processing (16a) to (16c) is performed in parallel.

(16a) The processing performed by the profiler 341a for acquiring the use status information 344 in the profile 401a. For example, the processing of monitoring the hypervisor calls invoked from the OS 351a through the virtual drivers 330 (or directly invoked from the OS 351a), as explained with regard to FIG. 4.

(16b) The processing performed by the profiler 341b for acquiring the use status information 344 in the profile 401b.

Figure 7:
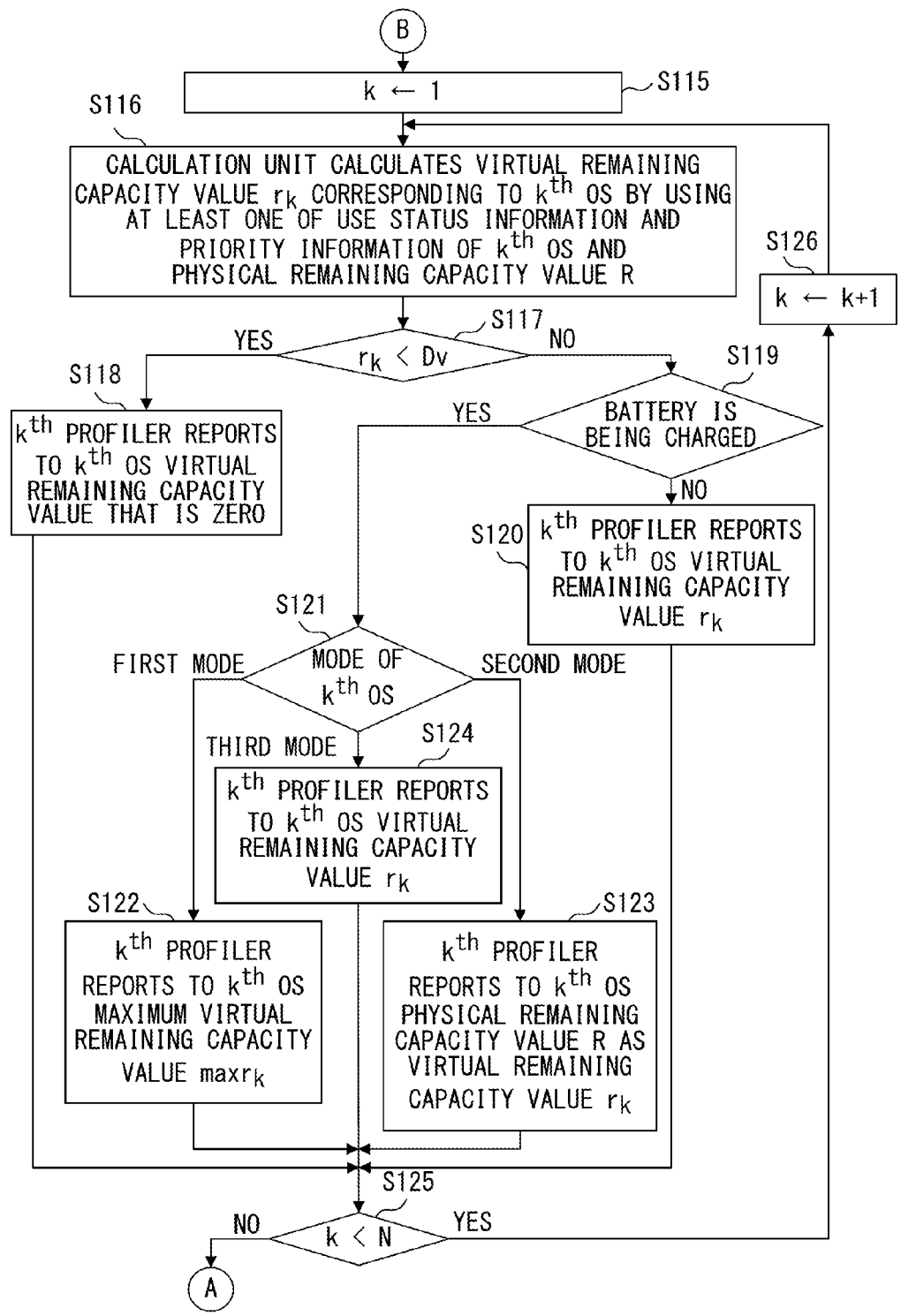

(16c) The processing of FIG. 6 to FIG. 7 that is performed by the virtual battery driver 340.

Next, detailed explanations are given with regard to processing of FIG. 6 to FIG. 7. When the information processing device 300 is powered on, the processing of FIG. 6 to FIG. 7 commences. The processing flow of FIG. 6 to FIG. 7 is controlled by the virtual battery driver 340.

First, in step S101, the virtual battery driver 340 performs an initialization appropriately. The details of the initialization may vary in accordance with the embodiments.

For example, the profiler 341a may read the priority information 345 and the mode information 346 that is associated with the OS 351a and stored in the non-volatile storage device 212 beforehand. Then, the profiler 341a may copy to the domain on the memory 211 that has been allocated for the profile 401a the priority information 345 and the mode information 346 that has been read. Further, the profiler 341a may clear the domain on the memory 211 for storing the use status information 344 in the profile 401a. The profiler 341b performs the initialization appropriately, similarly to the profiler 341a.

Further, the calculation unit 343 may calculate the initial value of the virtual remaining capacity value that corresponds to the OS 351a and the initial value of the virtual remaining capacity value that corresponds to the OS 351b, in step S101. Then, the profiles 341a and 342b may report the calculated initial value to the OSs 351a and 351b, respectively.

In some embodiments, the calculation and the reporting of the initial value in step S101 may be omitted. In addition, the method of calculating the initial value performed by the calculation unit 343 may vary in accordance with the embodiments. For example, the acquisition unit 342 may acquire the physical remaining capacity value. Then, the calculation unit 343 may calculate the initial values of the virtual remaining capacity values that respectively correspond to OSs 351a and 351b, on the basis of the priority information 345 and the physical remaining capacity value.

Alternatively, the initial values of the virtual remaining capacity values that respectively correspond to OSs 351a and 351b may be predetermined. In this case, the calculation unit 343 does not calculate the initial value. The profiler 341a reports to the OS 351a the initial value that is predetermined for the OS 351a and the profiler 341b reports to the OS 351b the initial value that is predetermined for the OS 351b.

In step S101, the initialization is performed appropriately as explained above, for example. Next, in step S102, the virtual battery driver 340 waits until a predetermined unit of time passes.

For example, the virtual battery driver 340 may wait until a predetermined unit of time passes, by using a timer interruption. A length of the unit of time is arbitrary in accordance with the embodiments. When the predetermined unit of time has passed, the processing of FIG. 6 to FIG. 7 moves on to step S103.

In step S103, the virtual battery driver 340 initializes an index variable k by substituting 1 into the index variable k.

In step S104, the virtual battery driver 340 instructs the $k^{th}$ profiler to generate and record the use status information 344. Then, the $k^{th}$ profiler generates the use status information 344 concerning the $k^{th}$ OS from the activity status of the $k^{th}$ OS during the current time period, and records the generated use status information 344.

Here, the "current time period" specifically means the unit of time that has passed in step S102. For example, when the unit of time is three minutes, the "current time period" is the latest three minutes.

As mentioned in the above (16a) to (16b), in parallel with the processing of FIG. 6 to FIG. 7, the profiler 341a monitors the access requests from the OS 351a to the devices, and the profiler 341b monitors the access requests from the OS 351b to the devices. In other words, while the lapse of the unit of time is awaited in step S102, the monitoring by the profilers 341a and 341b is performed in parallel.

For example, the profiler 341a may use a counter variable or a flag variable in order to temporarily store the activity status of the OS 351a. Specifically, the profiler 341a may update the counter variable for indicating the number of access requests (or the flag variable for indicating a presence or absence of the access requests), for example, every time the access request from the OS 351a to the device is made. Similarly, the profiler 341b may monitor the access requests from the OS 351a to the devices, by utilizing appropriate variables.

In the example of FIG. 3, the first profiler is the profiler 341a, and the first OS is the OS 351a. The second profiler is the profiler 341b, and the second OS is the OS 351b.

Accordingly, when k=1, in step S104, the profiler 341a generates the use status information 344 concerning the OS 351a from the activity status of the OS 351a that has been discovered from the monitoring during the current time period. For example, the profiler 341a may generate the use status information 344 on the basis of the values of the counter variables or the flag variables as mentioned above. As a matter of course, as explained with regard to FIG. 4, in some types of the devices, the profiler 341a may generate the use status information 344 through an inquiry to the hypervisor 320.

Then, the profiler 341a records the generated use status information 344 as part of the profile 401a. More specifically, the profiler 341a records the generated use status information 344 by associating it with the "last time period", as illustrated in FIG. 4.

The use status information 344 that has been associated with the $T^{th}$-to-last time period is discarded. Further, with regard to each j that satisfies 1≤j<T, the use status information 344 that has been associated with the $j^{th}$-to-last time period is newly associated with the $(j+1)^{th}$-to-last time period, in step S104.

For example, a memory area for storing the use status information 344 in the profile 401a may be a ring buffer whose buffer size is T. In this case, the profiler 341a may update the value of a pointer of the ring buffer in step S104.

Next, in step S105, the virtual battery driver 340 compares the value of the index variable k with the number N of the virtual machines in the information processing device 300. The number N of the virtual machines is, in other words, the number of OSs. Further, in the second embodiment, the number of the profiles in the virtual battery driver 340 is also N. In FIG. 3 and FIG. 4, the example where N=2 is illustrated.

When k<N, the OS for which the corresponding use status information 344 has not been recorded yet remains. Accordingly, the processing of FIG. 6 to FIG. 7 moves from step S105 to step S106.

On the other hand, when k≥N (specifically, when k=N), with regard to the current time period, for all of the OSs, the corresponding use status information 344 has already been recorded. Accordingly, the processing of FIG. 6 to FIG. 7 moves from step S105 to step S107.

In step S106, the virtual battery driver 340 increments the index variable k by 1. Then, the processing of FIG. 6 to FIG. 7 returns to step S104.

In the meantime, in step S107, the acquisition unit 342 acquires the physical remaining capacity value of the battery 311. Hereinafter, the physical remaining capacity value is defined as "R".

The acquisition unit 342 may access the battery I/F 203, for example, and acquire the physical remaining capacity value R from the battery I/F 203. The acquisition unit 342 reports the acquired physical remaining capacity value R to the calculation unit 343.

Next, in step S108, the calculation unit 343 decides whether or not to calculate the virtual remaining capacity value for reporting it to each of the profilers. Hereinafter, the virtual remaining capacity value to be reported to the $k^{th}$ OS is defined as "$r_k$".

In the second embodiment, when the physical remaining capacity value R is less than the predetermined threshold Dp, the calculation unit 343 does not calculate the individual virtual remaining capacity value $r_k$. Instead, when the physical remaining capacity value R is less than the threshold Dp, the calculation unit 343 considers the virtual remaining capacity value $r_k$ that corresponds to any OS to be zero (i.e., $r_k$=0, for any k that satisfies 1≤k≤N). The threshold Dp is a relatively small positive value.

Specifically, when R<Dp, the processing of FIG. 6 to FIG. 7 moves on to step S109. On the other hand, when R≥Dp, the processing of FIG. 6 to FIG. 7 moves on to step S113.

In step S109, the calculation unit 343 initializes the index variable k to 1.

Then, in step S110, the calculation unit 343 reports to the $k^{th}$ profiler the virtual remaining capacity value $r_k$ of zero. Then, the $k^{th}$ profiler reports to the $k^{th}$ OS the virtual remaining capacity value $r_k$ of zero.

Next, in step S111, the calculation unit 343 compares the value of the index variable k with the number of the OSs N.

When k<N, the OS to which the virtual remaining capacity value $r_k$ of zero has not been reported remains. Accordingly, the processing of FIG. 6 to FIG. 7 moves from step S111 to step S112.

On the other hand, when k≥N (specifically, when k=N), for all of the OSs, the virtual remaining capacity value $r_k$ of zero has already been reported. Accordingly, the processing of FIG. 6 to FIG. 7 returns from step S111 to step S102.

In step S112, the calculation unit 343 increments the index variable k by 1. Then, the processing of FIG. 6 to FIG. 7 returns to step S110.

In the meantime, in step S108, when the physical remaining capacity value R is judged to be not less than the threshold Dp, in step S113, the calculation unit 343 judges whether or not both of the following conditions (17a) and (17b) are satisfied.

(17a) The battery 311 (i.e., the battery 201) is being charged.

(17b) The flag 347 indicates that while the battery 311 is being charged, the physical remaining capacity value is regarded as the maximum value.

For example, the calculation unit 343 may issue to the battery I/F 203 an inquiry as to whether or not the battery 311 is being charged. In other words, the calculation unit 343 may judge whether the battery 311 is being charged though the access to the battery I/F 203.

When both of the above mentioned conditions (17a) and (17b) are satisfied, the processing of FIG. 6 to FIG. 7 moves on to step S114. On the other hand, when at least one of the conditions (17a) and (17b) is not satisfied, the processing of FIG. 6 to FIG. 7 moves on to step S115 of FIG. 7.

In step S114, the calculation unit 343 considers the physical remaining capacity value R to be the maximum value maxR. More specifically, the maximum value maxR is the maximum value of the domain of the physical remaining capacity value R that is decided in the specification of the battery 311.

In the meantime, the calculation unit 343 may acquire the maximum value maxR from the battery I/F 203 through the acquisition unit 342. Alternatively, the maximum value maxR may be recorded in the non-volatile storage device 212 beforehand as a constant.

After the calculation unit 343 overwrites the physical remaining capacity value R acquired by the acquisition unit 342 as mentioned above, the processing of FIG. 6 to FIG. 7 moves on to step S115 of FIG. 7.

In step S115, the calculation unit 343 initializes the index variable k to 1.

Then, in the next step S116, the calculation unit 343 calculates the virtual remaining capacity value $r_k$ that corresponds to the $k^{th}$ OS by using the information of the following (18a) and (18b).

(18a) At least one piece of the use status information 344 that corresponds to the $k^{th}$ OS and the priority information 345 that corresponds to the $k^{th}$ OS.

(18b) The physical remaining capacity value R (specifically, the value itself that has been acquired by the acquisition unit 342 in step S104, or the maximum value maxR that has been used in step S114 for overwriting the value).

The specific calculation method in step S115 may vary in accordance with the embodiments. For example, the calculation unit 343 may calculate the virtual remaining capacity value $r_k$ in accordance with expression (1).

$$r_k = QR \frac{e_k}{\frac{1}{N}\sum_{i=1}^{N} e_i} \quad (1)$$

In expression (1), "N" indicates the number of the virtual machines (in other words, the number of OSs). "R" indicates the physical remaining capacity value.

"Q" of expression (1) is a coefficient that satisfies $0<Q\leq1$. The value of the coefficient Q may be fixed or may be user definable. "$e_k$" is an evaluation value that indicates the characteristics of the $k^{th}$ OS.

According to expression (1), the virtual remaining capacity value $r_k$ is defined such that it monotonically increases with respect to the physical remaining capacity value R. Further, according to expression (1), the virtual remaining capacity value $r_k$ is defined such that it monotonically increases with respect to the ratio of the evaluation value $e_k$ of the $k^{th}$ OS to the average value of the evaluation values of all OSs.

Further, according to expression (1), as the value of the coefficient Q becomes large, the virtual remaining capacity value $r_k$ that is reported to the $k^{th}$ OS becomes large. As illustrated in FIGS. 5A and 5B, many OSs tend to use more resources as the remaining battery capacity becomes large. Accordingly, as the value of the coefficient Q becomes large, the electrical energy consumption increases, and the battery 201 tends to die earlier.

Therefore, in order to prolong the service life of the battery 311, it is preferable that the coefficient Q be a small value. On the other hand, in order to prioritize the performance, it is preferable that the coefficient Q be a relatively large value that is close to 1.

Specifically, the evaluation value $e_k$ of expression (1) is a value that is based on at least one of the use status information 344 that corresponds to the $k^{th}$ OS and the priority information 345 that corresponds to the $k^{th}$ OS. The calculation unit 343 may calculate the evaluation value $e_k$ by utilizing the history of the use status information 344 (i.e., by utilizing the use status information 344 from "the second-to-last time period" to "the $T^{th}$-to-last time period" in FIG. 4). Alternatively, the calculation unit 343 may calculate the evaluation value $e_k$ without utilizing the history of the use status information 344 (i.e., T may be 1 in FIG. 4).

Hereinafter, explanations are given further specifically for the various calculation methods of the virtual remaining capacity value $r_k$ in accordance with various definitions of the evaluation value $e_k$. All of the following expressions (2) to (5), and (7) are specific examples of expression (1). For ease of explanation, notations that are provided in the following (19a) to (19c) are used.

(19a) The priority of the $k^{th}$ OS is defined as "$p_k$". The priority $p_k$ is the value that is defined by the priority information 345 concerning the $k^{th}$ OS. According to the example of FIG. 4, $p_1=5$, and $p_2=2$.

(19b) With regard to the electrical energy consumption of the $k^{th}$ virtual machine, the estimated average power during the $j^{th}$-to-last time period is defined as "$c_{k,j}$". The average power $c_{k,j}$ is calculated by the calculation unit 343 from the use status information 344 that is generated by the $k^{th}$ profiler corresponding to the $j^{th}$-to-last time period. Examples of specific expressions for calculating the average power $c_{k,j}$ are mentioned later together with FIG. 8 to FIG. 9.

(19c) When the calculation unit 343 does not use the history of the use status information 344, for the sake of simplification, the average power $c_{k,j}$ is simply called "$c_k$" as well.

Hereinafter, for ease of explanation, explanations are given for specific examples of the calculation method of the virtual remaining capacity value $r_k$ calculated by the calculation unit 343 by using the above mentioned notations of (19a) to (19c).

First, the calculation unit 343 refers to the use status information 344 on the $k^{th}$ OS to calculate the average power $c_{k,j}$.

When the calculation unit 343 does not use the history of the use status information 344, the calculation unit 343 may calculate the virtual remaining capacity value $r_k$ in accordance with expression (2), for example, by using the average power $c_k$ (=$c_{k,1}$). Expression (2) represents the case in which $e_k = p_k c_k$.

$$r_k = QR \frac{p_k c_k}{\frac{1}{N} \sum_{i=1}^{N} p_i c_i} \quad (2)$$

Further, the calculation unit 343 may calculate the virtual remaining capacity value $r_k$ by using only one of the use status information 344 and the priority information 345, as represented by expressions (3) and (4). Expression (3) represents the case in which $e_k = c_k$, and expression (4) represents the case in which $e_k = p_k$.

$$r_k = QR \frac{c_k}{\frac{1}{N} \sum_{i=1}^{N} c_i} \quad (3)$$

$$r_k = QR \frac{p_k}{\frac{1}{N} \sum_{i=1}^{N} p_i} \quad (4)$$

As a matter of course, the calculation unit 343 may use the history of the use status information 344. The calculation unit 343 may calculate the virtual remaining capacity value $r_k$ in accordance with expression (5), for example, by using both the history of the use status information 344 and the priority information 345. Expression (5) represents the case in which the evaluation value $e_k$ is represented by expression (6).

$$r_k = QR \frac{\sum_{j=1}^{T} p_k c_{k,j}}{\frac{1}{N} \sum_{i=1}^{N} \sum_{j=1}^{T} p_i c_{i,j}} \quad (5)$$

$$e_k = \sum_{j=1}^{T} p_k c_{k,j} \quad (6)$$

The calculation unit 343 may calculate the virtual remaining capacity value $r_k$ in accordance with expression (7) by using the history of the use status information 344 and without using the priority information 345. Expression (7) represents the case in which the evaluation value $e_k$ is represented by expression (8).

$$r_k = QR \frac{\sum_{j=1}^{T} c_{k,j}}{\frac{1}{N} \sum_{i=1}^{N} \sum_{j=1}^{T} c_{i,j}} \quad (7)$$

$$e_k = \sum_{j=1}^{T} c_{k,j} \quad (8)$$

As a matter of course, the calculation unit 343 may calculate the virtual remaining capacity value $r_k$ in accordance with expressions other than those illustrated above (7) in step S116 in FIG. 7.

For example, a maximum value of the domain of the virtual remaining capacity value $r_k$ may be decided. Hereinafter, the maximum value is called "maxr$_k$".

For example, it may be defined that "maxr$_k$=maxR" with regard to arbitrary k. The definition that "maxr$_k$=maxR" is particularly preferable for the later mentioned second mode. Alternatively, when the priority information 345 is used, the maximum value maxr$_k$ of the virtual remaining capacity value $r_k$ may be statically defined in accordance with the maximum value R of the physical remaining capacity value R and the priority $p_k$.

The calculation unit 343 may calculate the virtual remaining capacity value $r_k$ by using expression (9) instead of expression (1). As mentioned above, all of the following expressions (2) to (5), and (7) are specific examples of expression (1). Accordingly, by appropriately defining the evaluation value $e_k$ of expression (9), similarly to expression (1) that is replaced by expression (9), each of expressions (2) to (5), and (7) may be replaced by other expressions.

$$r_k = \min\left(\text{maxr}_k, QR \frac{e_k}{\frac{1}{N} \sum_{i=1}^{N} e_i}\right) \quad (9)$$

After calculating the virtual remaining capacity value $r_k$, in the next step S117, the calculation unit 343 compares the virtual remaining capacity value $r_k$ with the threshold Dv. The threshold Dv is a relatively small positive value.

When $r_k$<Dv, the processing of FIG. 6 to FIG. 7 moves on to step S118. On the other hand, when $r_k \geq$ Dv, the processing of FIG. 6 to FIG. 7 moves on to step S119.

In step S118, the calculation unit 343 reports to the $k^{th}$ profiler a virtual remaining capacity value $r_k$ of zero, regardless of the value actually calculated in step S116. In other words, the calculation unit 343 re-evaluates the virtual remaining capacity value $r_k$ as zero. Then, the $k^{th}$ profiler reports to the $k^{th}$ OS a virtual remaining capacity value $r_k$ of zero. Then, the processing of FIG. 6 to FIG. 7 moves on to step S125.

On the other hand, when $r_k \geq$ Dv, in step S119, the calculation unit 343 judges whether or not the battery 311 is being charged by a method that is similar to step S113. Unless the battery 311 is being charged, the processing of FIG. 6 to FIG. 7 moves on to step S121.

In step S120, the calculation unit 343 reports to the $k^{th}$ profiler the virtual remaining capacity value $r_k$ calculated in step S116. Then, the $k^{th}$ profiler reports to the $k^{th}$ OS the reported virtual remaining capacity value $r_k$. Then, the processing of FIG. 6 to FIG. 7 moves on to step S125.

In step S121, the calculation unit 343 refers to mode information 346 concerning the $k^{th}$ OS. Hereinafter, explanations are given for first to third modes.

The first mode is the mode that reports to the OS the specific value while the physical battery 311 (i.e., the battery 201) is being charged. Specifically, the above mentioned "specific value" in the first mode is the maximum value of the domain of the virtual remaining capacity value $r_k$. The maximum value $\text{maxr}_k$ of the domain of the virtual remaining capacity value $r_k$ may differ in accordance with expressions that are used in calculating the virtual remaining capacity value $r_k$.

For example, when expression (9) is used, the maximum value $\text{maxr}_k$ of the domain of the virtual remaining capacity value $r_k$ is a positive value arbitrarily predetermined as the maximum value $\text{maxr}_k$. In addition, when expression (4) is used, the maximum value $\text{maxr}_k$ of the domain of the virtual remaining capacity value $r_k$ is decided in accordance with the maximum value of the domain of the physical remaining capacity value maxR and the priority $p_i$ of each OS.

When expression (2) is used, the maximum value $\text{maxr}_k$ of the domain of the virtual remaining capacity value $r_k$ depends on the minimum value of the electrical energy $c_i$ that corresponds to each of the virtual machines. In this case, in expression (2), for each i of i≠k, when $c_i$=0 and R=maxR, $r_k$=Q·maxR·N. Accordingly, $\text{maxr}_k$=Q·maxR·N.

The maximum value $\text{maxr}_k$, when expressions (3), (5), or (7) are used, is similar to the case when expression (2) is used.

While the battery 311 is being charged, there is no risk that the battery will run out, even when the OS does not particularly control the electrical energy consumption to reduce it. Accordingly, while the battery 311 is being charged, since an improved performance is prioritized over the reduction of the electrical energy consumption, the first mode may be used.

The second mode is the mode that reports to the OS the physical remaining capacity value R as the virtual remaining capacity value $r_k$, while the physical battery 311 is being charged. Some OSs perform calculations for displaying messages (or icons that correspond to the messages) such as "X minutes are left before the completion of charging" or "Y % of charging has been completed". In order for the calculations to be performed accurately, the OS that performs the calculations may be set in the second mode.

The virtual battery driver 340 may report to the OS that performs the calculations the maximum value maxR of the domain of the physical remaining capacity value R beforehand, as the value that is used for the calculations. Then, the OS of the second mode may calculate a time period for completing the charging or a current charging rate, from the maximum value maxR that has been reported beforehand and the current physical remaining capacity value R of the battery 311 that is being charged.

The third mode is a mode that does not discriminate between the case in which the physical battery 311 is being charged and the case in which the physical battery 311 is not being charged. The first mode has the effect of an improved performance for the battery 311 that is being charged, and the second mode has the effect of an improved accuracy of the above mentioned calculations. As a matter of course, however, the third mode is also available.

As a result of referring to the mode information 346 in step S121, when the mode of the $k^{th}$ OS is found to be the first mode, the processing of FIG. 6 to FIG. 7 moves on to step S122. When the mode of the $k^{th}$ OS is the second mode, the processing of FIG. 6 to FIG. 7 moves on to step S123. When the mode of the $k^{th}$ OS is the third mode, the processing of FIG. 6 to FIG. 7 moves on to step S124.

When the mode of the $k^{th}$ OS is the first mode, in step S122, the calculation unit 343 reports to the $k^{th}$ profiler the maximum value $\text{maxr}_k$ of the domain of the virtual remaining capacity value $r_k$ that corresponds to the $k^{th}$ virtual machine, regardless of the value actually calculated in step S116. In other words, the calculation unit 343 regards the virtual remaining capacity value $r_k$ as the maximum value $\text{maxr}_k$. Then, the $k^{th}$ profiler reports to the $k^{th}$ OS the reported maximum value $\text{maxr}_k$. Then, the processing of FIG. 6 to FIG. 7 moves on to step S125.

As mentioned above, the maximum value $\text{maxr}_k$ of the domain of the virtual remaining capacity value $r_k$ may be a predetermined constant, or may be a value that is determined in accordance with the expression of the virtual remaining capacity value $r_k$. The maximum value $\text{maxr}_k$ may be stored beforehand in the non-volatile storage device 212, for example. Then, the maximum value $\text{maxr}_k$ may be read from the non-volatile storage device 212 to the storage region in the memory space allocated to the virtual battery driver 340.

When the mode of the $k^{th}$ OS is the second mode, in step S123, the calculation unit 343 reports to the $k^{th}$ profiler the physical remaining capacity value R as the virtual remaining capacity value $r_k$. The physical remaining capacity value R reported as the virtual remaining capacity value $r_k$ in step S123 may be the value itself that has been acquired by the acquisition unit 342 in step S107, or may be the physical remaining capacity value R that has been rewritten into the maximum value maxR in step S114.

In other words, while the battery 311 is being charged, the calculation unit 343 may sometimes regard the virtual remaining capacity value $r_k$ as the same as the current actual physical remaining capacity value R of the battery 311. Further, when the battery 311 is being charged, the calculation unit 343 may sometimes regard the virtual remaining capacity value $r_k$ as the same as the maximum value maxR of the domain of the physical remaining capacity value R.

At all events, when the calculation unit 343 reports to the $k^{th}$ profiler the physical remaining capacity value R as the virtual remaining capacity value $r_k$, the $k^{th}$ profiler reports to the $k^{th}$ OS the physical remaining capacity value R as the virtual remaining capacity value $r_k$. Then, the processing of FIG. 6 to FIG. 7 moves on to step S125.

When the mode of the $k^{th}$ OS is the third mode, in step S124, the calculation unit 343 reports to the $k^{th}$ profiler the virtual remaining capacity value $r_k$ calculated in step S116. Then, the $k^{th}$ profiler reports to the $k^{th}$ OS the reported virtual remaining capacity value $r_k$. Then, the processing of FIG. 6 to FIG. 7 moves on to step S125.

In the meantime, step S125 is executed after the $k^{th}$ profiler has reported to the $k^{th}$ OS the virtual remaining capacity value $r_k$, in steps S118, S120, S122, S123, or S124. Specifically, in step S125, the calculation unit 343 compares the value of the index variable k with the number of the OSs N.

When k<N, the OS to which the virtual remaining capacity value $r_k$ has not been reported remains. Accordingly, the processing of FIG. 6 to FIG. 7 moves from step S125 to step S126.

On the other hand, when k≥N (specifically, when k=N), for all of the OSs, the virtual remaining capacity value $r_k$ has already been reported. Accordingly, the processing of FIG. 6 to FIG. 7 returns from step S125 to step S102.

In step S116, the calculation unit 343 increments the index variable k by 1. Then, the processing of FIG. 6 to FIG. 7 returns to step S116.

With the processing of FIG. 6 to FIG. 7 that has been explained above, the virtual remaining capacity value is reported on a regular basis to each of the OSs. Each of the OSs performs an appropriate control with regard to the electrical energy in accordance with the reported virtual remaining capacity value and a rule set as illustrated in FIGS. 5A and 5B.

Next, explanations are given for specific calculation examples in reference to FIG. 8 to FIG. 9. FIG. 8 illustrates an example of calculating virtual remaining capacity value $r_k$ by not using a history in the second embodiment. FIG. 9 illustrates an example of calculating virtual remaining capacity by using a history in the second embodiment.

Specifically, five calculation examples 601 to 605 are illustrated in FIG. 8 to FIG. 9. The calculation example 601 is an example concerning the third comparative example in which the virtual remaining capacity value is not utilized.

The calculation example 602 is an example in which expression (2) is utilized in the second embodiment and Q=0.1 in expression (2). The calculation example 602 is an example in which expression (2) is utilized in the second embodiment and Q=1 in expression (2). Namely, when the calculation examples 602 and 603 are compared, the calculation example 602 is an example that attaches importance to prolonging the service life of the battery 311, and the calculation example 603 is an example that attaches importance to the performance.

The calculation example 604 is an example in which expression (5) is utilized in the second embodiment, and T=2 and Q=0.1 in expression (5). The calculation example 605 is an example in which expression (5) is utilized in the second embodiment, and T=2 and Q=1 in expression (5). Namely, when the calculation examples 604 and 605 are compared, the calculation example 604 is an example that attaches importance to prolong the service life of the battery 311, and the calculation example 605 is an example that attaches importance to the performance.

Before specifically referring to the calculation examples 601 to 605, explanations are given for some assumptions. In the examples of FIG. 8 to FIG. 9, the following (20a) to (20m) are assumed.

(20a) Unlike in the example of FIG. 4, it is assumed that the priority $p_1$ that corresponds to the OS 351a (i.e., that corresponds to the virtual machine 350a) is 1. Unlike in the example of FIG. 4, it is assumed that the priority $p_2$ that corresponds to the OS 351b (i.e., that corresponds to the virtual machine 350b) is 3.

(20b) As mentioned in the above mentioned (14f), it is assumed that two of the cores in the quad-core physical CPU are allocated to two virtual CPU cores of the virtual machine 350a, and that the remaining two of the cores are allocated to two virtual CPU cores of the virtual machine 350b. In this case, the virtual machines 350a and 350b do not share any physical CPU cores. Accordingly, it is assumed that the hypervisor 320, upon receipt of the command to change the clock frequency of the CPU core from the OS 351a or 351b, actually changes the clock frequency in accordance with the command.

(20c) It is assumed that the power that allows one physical CPU core to run at 1 GHz and to execute instructions at a use rate of 100% is 1 W. It is assumed that the power that allows one physical CPU core to run at 500 MHz and to execute instructions at the use rate of 100% is 0.5 W. It is assumed that the power that allows one physical CPU core to run at 100 MHz and to execute instructions at the use rate of 100% is 0.1 W.

(20d) It is assumed that the electrical energy that is consumed in a certain period of time is proportional to the use rate of the physical CPU core during the certain period of time. Here, for simplification of explanation, it is assumed that the use rates of both of the two physical CPU cores allocated to the two virtual CPU cores of the virtual machine 350a are always 100%. Similarly, it is assumed that the use rates of both of the two physical CPU cores allocated to the two virtual CPU cores of the virtual machine 350b are always 100%.

(20e) It is assumed that the sum of the electrical energy consumption resulting from the activities of the virtual machine 350a and the electrical energy consumption resulting from the activities of the virtual machine 350b equals the electrical energy consumption of the information processing device 300 as a whole. For the sake of simplification, it is assumed that the electrical energy consumption resulting from the activities of devices other than the CPU 204, the GPU 205, the touch panel 206, and the WiFi module 216 is negligible.

(20f) It is assumed that the OS 351a uses rule set 500 of FIG. 5A, and that the OS 351b uses rule set 540 of FIG. 5B. In the tables of FIG. 8 to FIG. 9, a horizontal ruled line of a position at which the rule applied by the OS is changed is thick for emphasis.

(20g) It is assumed that the electrical energy that is consumed by the communication performed by the WiFi module 216 is 0.01 Wh/kB.

(20h) In response to the request from the application 352a, the OS 351a transmits or receives a frame through the virtual WiFi module of the virtual machine 350a. It is assumed that the data rate of the communication through the virtual WiFi module for the virtual machine 350a is usually 1000 kB/h. Similarly, it is assumed that the data rate of the communication through the virtual WiFi module for the virtual machine 350b is usually 1000 kB/h. The data rate may sometimes be restricted by the application of rule 508 or 547.

(20i) It is assumed that there is one dual-core physical GPU. It is also assumed that the first core is allocated to the virtual GPU for the virtual machine 350a, and that the second core is allocated to the virtual GPU for the virtual machine 350b.

(20j) It is assumed that there are two types of modes, a "normal mode" and a "power-saving mode", in the modes of the GPU. For example, the clock frequencies of the GPU may be different between the two types of modes. It is further assumed that the power that allows the physical GPU core to run in the normal mode and the power that allows the physical GPU core to run in the power-saving mode are 2 W and 1 W, respectively. It is assumed that, in the use status information 344, with regard to the physical GPU core, the mode is recorded. This assumption is in contrast with FIG. 4, where "ON" or "OFF" is recorded.

(20k) The OSs 351a and 351b may issue a command (e.g., a hypervisor call) to change the mode of the virtual GPU. Since the virtual machines 350a and 350b do not share any physical GPU core, it is assumed that the hypervisor 320 actually changes the mode of the physical GPU core that corresponds to the virtual GPU, in accordance with the command.

(20l) It is assumed that when all of the processes are in a suspended state in a certain virtual machine, the power for executing the virtual machine is 0.01 W, taking all of the devices into consideration. It is further assumed that the power for executing the virtual machine is 0 W when the OS is forced to sleep.

(20m) It is assumed that when at least one of the OSs 351a and 351b issues the command to dim the backlight of the virtual display, the hypervisor 320 actually dims the backlight of the touch panel 206, which is the physical device. It is assumed that the power that allows the backlight of the touch panel 206 to glow with a normal strength is 4 W and that the power that allows the backlight of the touch panel 206 to glow at the dimmed level is 1 W. It is also assumed that when all of the OSs are forced to sleep, the power supply to the touch panel 206 is blocked.

In the third comparative example illustrated in the calculation example 615, the same physical remaining capacity value R is reported to the OSs 351a and 351b. On the other hand, in the second embodiment, the virtual remaining capacity values $r_1$ and $r_2$ are respectively reported to the OSs 351a and 351b. However, the OSs 351a and 351b do not recognize whether the reported values are the physical remaining capacity values or the virtual remaining capacity values, but apply the rule appropriately, in accordance with the reported values.

When a remaining battery capacity of not less than 20 Wh is reported to the OS 351a, according to FIG. 5A, the OS 351a applies rules 504 to 505. Therefore, according to the above mentioned assumptions (20a) to (20m), the power for executing the virtual machine 350a after applying rules 504 to 505 is the sum of the values of the following (21a) to (21d), and specifically, 13.5 (=1+0.5+2+10) W.

(21a) 1 W for the first core of the physical CPU (the first core of the physical CPU is allocated to the first core of the virtual CPU for the virtual machine 350a, runs at 1 GHz, and the use rate is 100%).

(21b) 0.5 W for the second core of the physical CPU (the second core of the physical CPU is allocated to the second core of the virtual CPU for the virtual machine 350a, runs at 500 MHz, and the use rate is 100%).

(21c) 2 W for the first core of the physical GPU (the first core of the physical GPU is allocated to the virtual GPU for the virtual machine 350a and runs in a normal mode).

(21d) 10 W for the WiFi module 216 (=1000[kB/h]×0.01 [Wh/kB]).

When a remaining battery capacity of not less than 5 Wh but less than 20 Wh is reported to the OS 351a, according to FIG. 5A, the OS 351a applies rules 506 to 509. Therefore, according to the above mentioned assumptions (20a) to (20m), the power for executing the virtual machine 350a after applying rules 506 to 509 is the sum of values of the following (22a) to (22d), and specifically, 2.61 (=0.5+0.1+2+0.1) W.

(22a) 0.5 W for the first core of the physical CPU (the first core of the physical CPU is allocated to the first core of the virtual CPU for the virtual machine 350a, runs at 500 MHz, and the use rate is 100%).

(22b) 0.1 W for the second core of the physical CPU (the second core of the physical CPU is allocated to the second core of the virtual CPU for the virtual machine 350a, runs at 100 MHz, and the use rate is 100%).

(22c) 2 W for the first core of the physical GPU (the first core of the physical GPU is allocated to the virtual GPU for the virtual machine 350a and runs in a normal mode).

(22d) 0.01 W for the WiFi module 216 (=1[kB/h]×0.01 [Wh/kB]).

When a remaining battery capacity of less than 5 Wh is reported to the OS 351a, according to FIG. 5A, the OS 351a applies rule 510. Therefore, according to the above mentioned assumptions (20a) to (20m), the power for executing the virtual machine 350a after applying rule 510 is 0 W.

When a remaining battery capacity of not less than 30 Wh is reported to the OS 351b, according to FIG. 5B, the OS 351b applies rules 544 to 545. Therefore, according to the above mentioned assumptions (20a) to (20m), the power for executing the virtual machine 350b after applying rules 544 to 545 is the sum of values of the following (23a) to (23d), and specifically, 13(=1+0+2+10) W.

(23a) 1 W for the third core of the physical CPU (the third core of the physical CPU is allocated to the first core of the virtual CPU for the virtual machine 350b, runs at 1 GHz, and the use rate is 100%).

(23b) 0 W for the fourth core of the physical CPU (although the fourth core of the physical CPU is allocated to the second core of the virtual CPU for the virtual machine 350b, it is stopped by applying rule 545).

(23c) 2 W for the second core of the physical GPU (the second core of the physical GPU is allocated to the virtual GPU for the virtual machine 350b and runs in a normal mode).

(23d) 10 W for the WiFi module 216 (=1000[kB/h]×0.01 [Wh/kB]).

When a remaining battery capacity of not less than 7.5 Wh and less than 30 Wh is reported to the OS 351b, according to FIG. 5B, the OS 351b applies rules 544 to 547. Therefore, according to the above mentioned assumptions (20a) to (20m), the power for executing the virtual machine 350b after applying rules 544 to 547 is the sum of values of the following (24a) to (24d), and specifically, 3(=1+0+2+0) W.

(24a) 1 W for the third core of the physical CPU (the third core of the physical CPU is allocated to the first core of the virtual CPU for the virtual machine 350b, runs at 1 GHz, and the use rate is 100%).

(24b) 0 W for the fourth core of the physical CPU (although the fourth core of the physical CPU is allocated to the second core of the virtual CPU for the virtual machine 350b, it is stopped by applying rule 545).

(24c) 2 W for the second core of the physical GPU (the second core of the physical GPU is allocated to the virtual GPU for the virtual machine 350b and runs in a normal mode).

(24d) 0 W for the WiFi module 216 (by applying rule 547, the communication using the WiFi module 216 is not performed).

When a remaining battery capacity of less than 7.5 Wh is reported to the OS 351b, according to FIG. 5B, the OS 351b applies rules 544 to 548. Therefore, according to the above mentioned assumptions (20a) to (20m), the power for executing the virtual machine 350b after applying rules 544 to 548 is the sum of values of the following (24a) to (24d), and specifically, 2(=1+0+1+0) W.

(25a) 1 W for the third core of the physical CPU (the third core of the physical CPU is allocated to the first core of the virtual CPU for the virtual machine 350b, runs at 1 GHz, and the use rate is 100%).

(25b) 0 W for the fourth core of the physical CPU (although the fourth core of the physical CPU is allocated to the second core of the virtual CPU for the virtual machine 350b, it is stopped by applying rule 545).

(25c) 1 W for the second core of the physical GPU (the second core of the physical GPU is allocated to the virtual GPU for the virtual machine 350b and runs in a power-saving mode).

(25d) 0 W for the WiFi module 216 (by applying rule 547, the communication using the WiFi module 216 is not performed).

In the meantime, rule set 540 of FIG. 5B does not include the rule concerning a forced sleep. Accordingly, a case in which both of the OSs 351a and 351b are forced to sleep does not occur. Therefore, on the basis of the above mentioned assumptions (20f) and (20m), the power supply to the touch panel 206 is not blocked.

In addition, rule set 500 of FIG. 5A does not include the rule concerning dimming the backlight. Accordingly, the electrical energy for the touch panel 206 does not change in accordance with the remaining battery capacity that is reported to the OS 351a.

Accordingly, unless the OS 351b does not apply rule 546 (i.e., when a remaining battery capacity of not less than 30 Wh is reported to the OS 351b), the electrical energy for making the touch panel 206 run is 4 W. On the other hand, when the OS 351b applies rule 546 (i.e., when the remaining battery capacity of less than 30 Wh is reported to the OS 351b), the electrical energy for making the touch panel 206 run is 1 W.

Next, explanations are given for the calculation examples in reference to FIG. 8 to FIG. 9, on the basis of the explanations that have been given above.

In FIG. 8 to FIG. 9, "t" is a point in time with reference to a time at which the information processing device 300 is powered on with the battery 311 that has been fully charged. In other words, "t" indicates a length of time that has passed from the point in time of powering on the information processing device 300 with the battery 311 that has been fully charged. For ease of explanation, all of the calculation examples 601 to 605 of FIG. 8 to FIG. 9 are the examples of the case in which the unit of time of step S102 of FIG. 6 is 1 hour. As a matter of course however, the unit of time may be shorter than 1 hour.

In FIG. 8 to FIG. 9, "R" indicates the physical remaining capacity value of the battery 311 at the time t. In the example of FIG. 8 to FIG. 9, since R=100 when t=0, from the above mentioned definition of the time t, maxR=100.

During the time period from time t to time (t+1), the power for the execution of the virtual machine 350a may be regarded as constant. In FIG. 8 to FIG. 9, this constant power is indicated as "$c_1$". Namely, according to the control that is performed by the OS 351a at time t on the basis of the remaining battery capacity reported to the OS 351a at time t and rule set 500, during the time period from time t to time (t+1), the power for the execution of the virtual machine 350a is the constant value $c_1$.

Similarly, during the time period from time t to time (t+1), the power for the execution of the virtual machine 350b may be regarded as constant. In FIG. 8 to FIG. 9, this constant power is indicated as "$c_2$".

Further, during the time period from time t to time (t+1), the power for allowing the touch panel 206 to operate may be regarded as constant. In FIG. 8 to FIG. 9, this constant power is indicated as "$c_L$".

From the assumption of the above mentioned (20e), the electrical energy consumption for the information processing device 300 as a whole during the time period from time t to time (t+1) may be indicated, as "$(c_1+c_2+c_L)$ [W]×1 [h]" by using the values $c_1$, $c_2$, and $c_L$ of the power at time t. The physical remaining capacity value R of time (t+1) is smaller than the physical remaining capacity value R of time t just by this electrical energy consumption.

For example, the calculation example 601 of FIG. 8 indicates the third comparative example in which no virtual remaining capacity value is used.

As indicated by the calculation example 601, in the third comparative example, when the physical remaining capacity value R that is reported to the OS 351a is not less than 20 Wh (i.e., from the row of t=0 to the row of t=2), $c_1$=13.5 W (i.e., the sum of the above mentioned (21a) to (21d)). When the physical remaining capacity value R that is reported to the OS 351a is not less than 5 Wh but is less than 20 Wh (i.e., in the row of t=3), $c_1$=2.61 W (i.e., the sum of the above mentioned (22a) to (22d)). When the physical remaining capacity value R that is reported to the OS 351a is less than 5 Wh (i.e., in the row of t=4), $c_1$=0 W (since rule 510 is applied).

In the third comparative example, when the physical remaining capacity value R that is reported to the OS 351b is not less than 30 Wh (i.e., from the row of t=0 to the row of t=2), $c_2$=13 W (i.e., the sum of the above mentioned (23a) to (23d)) and $c_L$=4 W. When the physical remaining capacity value R that is reported to the OS 351b is not less than 7.5 Wh but is less than 30 Wh (i.e., in the row of t=3), $c_2$=3 W (i.e., the sum of the above mentioned (24a) to (24d)) and $c_L$=1 W. When the physical remaining capacity value R that is reported to the OS 351b is less than 7.5 Wh (i.e., in the row of t=4), $c_2$=2 W (since rule 510 is applied) and $c_L$=1 W.

As indicated by the calculation example 601, in the third comparative example, when time t=5, the battery runs out. On the other hand, in the calculation examples 602 to 605 according to the second embodiment, the dying of the battery occurs at time t=6 or later.

Specifically, in the calculation examples 602 to 605, the virtual remaining capacity values $r_1$ and $r_2$ in accordance with the priority as the above mentioned (20a) are respectively reported to the OSs 351a and 351b. Therefore, the activating time for the virtual machine 350b that has a relatively high priority is longer than the calculation example 601 in the third comparative example.

Namely, in the calculation examples 602 to 605, small virtual remaining capacity values $r_1$ are reported to the OS 351a that has a relatively low priority. Accordingly, a tendency for the OS 351a to suppress the utilization of the device from the virtual machine 350a is more pronounced in the calculation examples 602 to 605 than in the calculation example 601.

In the meantime, all of the calculation examples 602 to 605 share a commonality with regard to the following matters (26a) to (26g).

(26a) When the virtual remaining capacity value $r_1$ that is reported to the OS 351a is not less than 20 Wh (e.g., from the row of t=0 to the row of t=2 of the calculation example 603), $c_1$=13.5 W (i.e., the sum of the above mentioned (21a) to (21d)).

(26b) When the virtual remaining capacity value $r_1$ that is reported to the OS 351a is not less than 5 Wh but is less than 20 Wh (e.g., in the row of t=0 of the calculation example 602, or the row of t=0 of the calculation example 604), $c_1$=2.61 W (i.e., the sum of the above mentioned (22a) to (22d)).

(26c) When the virtual remaining capacity value $r_1$ that is reported to the OS 351a is less than 5 Wh (e.g., in the row of t=1, and succeeding rows of the calculation example 602), $c_1$=0 W (since rule 510 is applied).

(26d) When the virtual remaining capacity value $r_2$ that is reported to the OS 351b is not less than 30 Wh (e.g., from the row of t=0 to the row of t=2 of the calculation example 605), $c_2$=13 W (i.e., the sum of the above mentioned (23a) to (23d)) and $c_L$=4 W.

(26e) When the virtual remaining capacity value $r_2$ that is reported to the OS 351b is not less than 7.5 Wh but is less than 30 Wh (e.g., from the row of t=0 to the row of t=14 of the calculation example 602), $c_2$=13 W (i.e., the sum of the above mentioned (24a) to (24d)) and $c_L$=1 W.

(26f) When the virtual remaining capacity value $r_2$ that is reported to the OS 351b is less than 7.5 Wh (e.g., in the row of t=5 of the calculation example 603), $c_2$=2 W (i.e., the sum of the above mentioned (25a) to (25d)) and $c_L$=1 W.

(26g) The virtual remaining capacity values $r_1$ and $r_2$ in the row of t=0 are the values calculated by the calculation unit 343 in initializing step S101 and are respectively reported to the OSs 351a and 351b by the profilers 341a and 341b. Since the use status information 344 has not been accumulated in initializing step S101, the calculation unit 343 may calculate the virtual remaining capacity values $r_1$ and $r_2$ by using the priority information 345 and the physical remaining capacity value R, in accordance with expression (4). In the calculation examples 602 to 605, the virtual remaining capacity values $r_1$ and $r_2$ that are calculated when t=0, in accordance with expression (4) as mentioned above, are indicated.

Here, supplementary explanations are given for the relationship among the power $c_1$, the rule sets of FIGS. 5A and 5B, and the processing of FIG. 6 and FIG. 7. The relationship between each of (26b) to (26f) and FIG. 5A to FIG. 7 is similar to the relationship between (26a) and FIG. 5A to FIG. 7.

When the virtual remaining capacity value $r_1$ that has been reported by the processing of FIG. 6 to FIG. 7 to the OS 351a at the time t is not less than 20 Wh, the OS 351a applies rules 504 to 505 of FIG. 5A, in accordance with the notice. Rules 504 to 505 are regarded to have been applied at approximately the time t.

Further, as described above, in the calculation examples 601 to 605 of FIG. 8 to FIG. 9, the unit of time of step S102 of FIG. 6 is 1 hour. During this unit of time, a new virtual remaining capacity value $r_1$ is not reported to the OS 351a. Accordingly, during this unit of time, the OS 351a does not change the rule to be applied, either. Therefore, during the unit of time from time t to time (t+1), the power for executing the virtual machine 350a may be regarded as constant. Namely, during the unit of time of step S102 of FIG. 6 after the profiler 341a has reported to the OS 351a the virtual remaining capacity value $r_1$ of not less than 20 Wh, the power $c_1$ for executing the virtual machine 350a may be regarded as the constant value of 13.5 W as mentioned in (26a).

In the meantime, as described above, the electrical energy of 13.5 W is the sum of the electrical energy indicated in (21a) to (21d). The electrical energy indicated in (21a) to (21d) is specifically the value that is calculated in step S116 at a timing that may be regarded by the calculation unit 343 as approximately the time (t+1).

Specifically, after the lapse of the unit of time in the above mentioned step S102, at the timing that may be regarded as approximately the time (t+1), step S104 is executed. The use status information 344 of the profile 401a that is generated in step S104 includes the values of "1 GHz", "100%", "500 MHz", "100%", a "normal mode", and "1000 kB".

(27a) The first core of the physical CPU that is allocated to the first core of the virtual CPU for the virtual machine 350a runs at 1 GHz during the current unit of time (i.e., the time period from time t to time (t+1)).

(27b) The use rate of the first core of the physical CPU resulting from the activities of the virtual machine 350a (i.e., resulting from the activities of the OS 351a and the application 352a) is 100% in the current unit of time.

(27c) The second core of the physical CPU that is allocated to the second core of the virtual CPU for the virtual machine 350a runs at 500 MHz during the current unit of time.

(27d) The use rate of the second core of the physical CPU resulting from the activities of the virtual machine 350a is 100% in the current unit of time.

(27e) The first core of the physical GPU that is allocated to the virtual GPU for the virtual machine 350a run in the normal mode during the current unit of time.

(27f) The data volume of the communication in which the virtual machine 350a is a transmission source or a transmission destination from among the communications that have been performed during the current unit of time through the WiFi module 216 is 1000 kB (=1000[kB/h]×1 [h]).

Since the difference between the timing for executing step S104 and the timing for executing step S116 is very small, it may be regarded that step S116 is executed approximately at time (t+1). Namely, at approximately time (t+1), in step S116, the calculation unit 343 calculates the power $c_1$ as 13.5 W by using the use status information 344 that includes the values illustrated in (27a) to (27f).

The specific method of calculating the power $c_1$ that is performed by the calculation unit 343 includes the addition, as explained in reference to (21a) to (21d). Namely, the calculation unit 343 calculates the power $c_1$ from the power that corresponds to each of the physical devices. The calculation unit 343 calculates the power that corresponds to each of the physical devices in accordance with the specific power calculation model as illustrated in the above mentioned assumptions (20c), (20d), (20g), (20h), (20j), and the like.

As a matter of course, it is preferable that the calculation unit 343 calculate the electrical energy that corresponds to each of the physical devices and the total power $c_1$ in accordance with appropriate expressions that indicate an power calculation model that is fitted to the embodiments. For example, the calculation unit 343 may calculate the electrical energy for the physical CPU core in accordance with a method that is different from the method of the above mentioned (20d) (i.e., the method of simply multiplying the use rate by the electrical energy in accordance with the clock frequency).

Similarly to the power $c_1$, in step S116 at approximately time (t+1), the calculation unit 343 calculates the power $c_2$ as well. Then, the calculation unit 343 calculates a new virtual remaining capacity value $r_1$ by using the power $c_1$ and power $c_2$.

Further, as illustrated in FIG. 7, step S116 is executed in correspondence to each OS. Namely, the calculation unit 343 calculates a new virtual remaining capacity value $r_2$, similarly to $r_1$. Here, the time period taken to execute the repetitive loop of steps S115 to S126 of FIG. 7 is negligible. Accordingly, it may be considered that at approximately time (t+1), the new virtual remaining capacity values $r_1$ and $r_2$ are calculated, re-evaluated as appropriate, and reported to the OSs 351a and 351b, respectively.

Here, in the table of each calculation example of FIG. 8 to FIG. 9, the electrical energy during the time period from time t to time (t+1) is written in the row of time t. Therefore, the value of "13.5 W" that indicates the power $c_1$ calculated in step S116 at approximately (t+1) is written in the row of time t in the table of each of the calculation examples of FIG. 8 to FIG. 9, as mentioned above.

Accordingly, as summarized in the above mentioned (26a), when the virtual remaining capacity value $r_1$ in the row of time t is not less than 20 Wh, the power $c_1$ in the same row is 13.5 W. Similarly, with regard to each of the above mentioned (26b) to (26f), it can be said that the power $c_1$ and the power $c_2$ in the calculation examples 602 to 605 indicate the calculation results by the calculation unit 343.

As mentioned above, the calculation examples 604 and 605 are the examples that utilize expression (5). More specifically, the calculation examples 604 and 605 are the examples when T=2, in expression (5).

However, when t=1, only the use status information 344 in the last time period (i.e., the unit of time from t=0 to t=1) has been accumulated and the use status information 344 in the $T^{th}$-to-last time period (i.e., in the second-to-last time period) has not yet been accumulated. Accordingly, the virtual remaining capacity values $r_1$ and $r_2$ in the row of t=1 of the calculation examples 604 and 605 are the values that are calculated in accordance with expression (5) in which it is regarded that T=1 (in other words, the values that are calculated in accordance with expression (2)).

In other words, the calculation unit 343 may calculate the virtual remaining capacity value by utilizing only the use status information 344 of the time period of less than T until the use status information 344 that respectively corresponds to the time period of a predetermined number (T) even when utilizing expression (5).

Next, explanations are given for the third to fifth embodiments in reference to FIG. 10 to FIG. 13. In the following explanations, with regard to the commonality with the second embodiment, explanations may sometimes be given by using the reference numerals in FIG. 3 to FIG. 7.

The third embodiment is different from the second embodiment in that the hypervisor 320 of FIG. 3 performs processing of FIG. 11. However, the third embodiment is similar to the second embodiment with regard to other matters.

Figure 12:
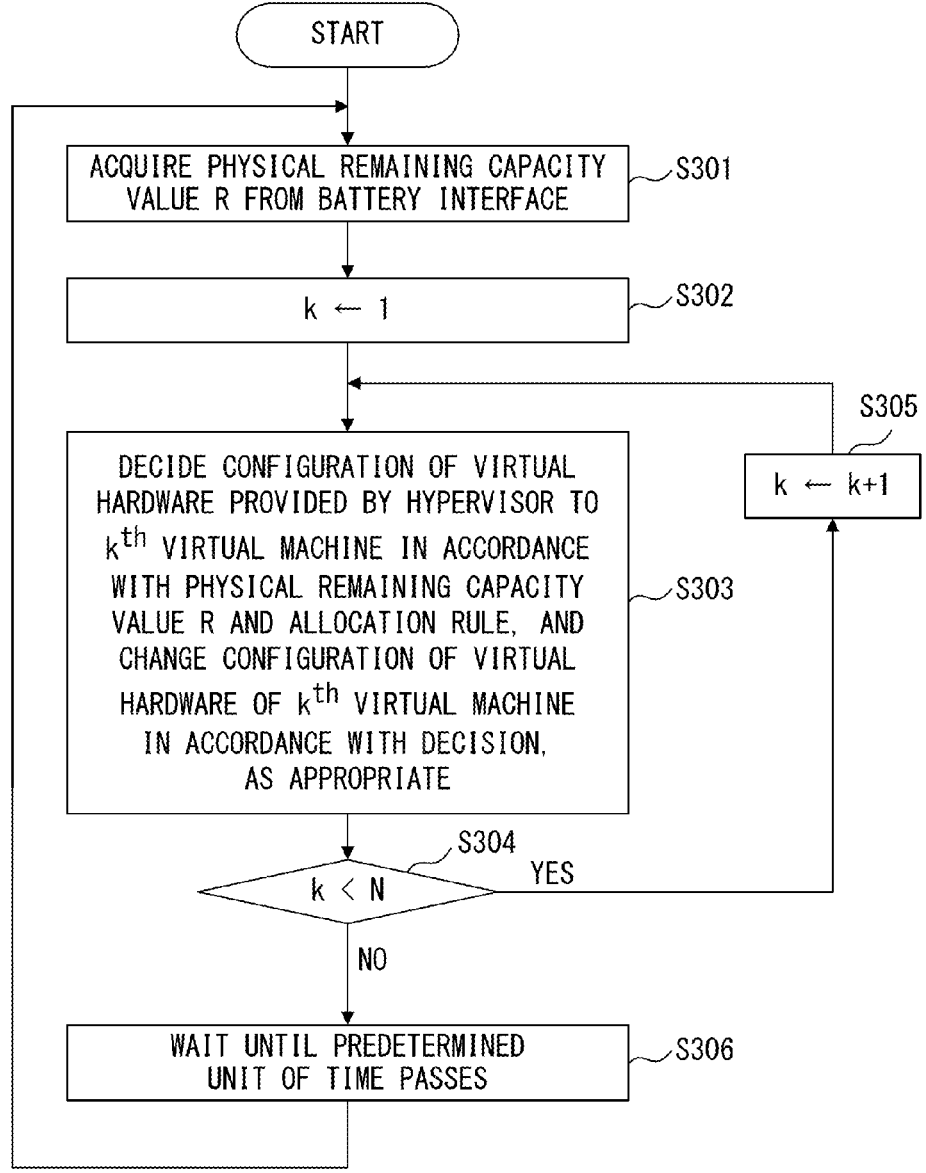
FIG. 12 illustrates a flowchart of processing that is performed by a hypervisor in the fourth to fifth embodiments.

The fourth embodiment is different from the third embodiment in that the hypervisor 320 performs processing of FIG. 12 instead of the processing of FIG. 11. However, the fourth embodiment is similar to the third embodiment with regard to other matters.

Although the fifth embodiment is similar the fourth embodiment, in the virtual battery driver 340 of the fifth embodiment, the calculation unit 343 and the profilers 341a to 341b are omitted. Accordingly, in the fifth embodiment, each piece of information that is used by the calculation unit 343 (i.e., the use status information 344, the priority information 345, the mode information 346, and the flag 347) is also omitted. Instead, in the fifth embodiment, the acquisition unit 342 reports the acquired physical remaining capacity value R to each of the OSs 351a and 351b. The acquisition unit 342 may report to the OSs 351a and 351b at specific intervals.

Hereinafter, first, explanations are given for the commonality in the third to fifth embodiments.

In the third to fifth embodiments, the configuration of the virtual hardware that is provided by the hypervisor 320 to each of the plurality of the virtual machines 350a to 350b is dynamically changed in accordance with the physical remaining capacity value or the virtual remaining capacity value. In other words, in the third to fifth embodiments, the hypervisor 320 executes the hot-add or the hot-remove of the virtual hardware elements in accordance with the physical remaining capacity value or the virtual remaining capacity value.

The hot-removed virtual hardware elements are not accessed from the virtual machine. Accordingly, the hypervisor 320 may block the power supply to the physical hardware elements (e.g., cores in the physical CPU) that have been allocated to the hot-removed virtual hardware elements (e.g., the virtual CPUs). By blocking the power supply to the physical hardware elements, the electrical energy consumption in the information processing device 300 as a whole is reduced.

As a matter of course, the same physical hardware element may sometimes be allocated to each of the virtual hardware elements of the plurality of the virtual machines. In this case, when the hypervisor 320 hot-removes the virtual hardware element from a certain virtual machine, the hypervisor 320 may decrease the activity frequency of the physical hardware element that is allocated to the hot-removed virtual hardware element. With the decreased activity frequency, the electrical energy consumption is also reduced.

As explained so far above, in the third to fifth embodiments, with the dynamic change of the configuration of the virtual hardware, the reduction of the electrical energy consumption in the information processing device 300 as a whole is intended. With the reduced electrical energy consumption, the service life of the battery 311 is prolonged (i.e., an availability time period of the information processing device 300 is prolonged). Hereinafter, further detailed explanations are given for the third to fifth embodiments in reference to FIG. 10 to FIG. 13.

FIG. 10 illustrates an example of the allocation rule that is used in the third to fifth embodiments. An allocation rule that is common to all the virtual machines may be used or an allocation rule that differs for each virtual machine may be used. In the third to fifth embodiments, an allocation rule that is different for each of the virtual machines is used.

The allocation rule is the rule that specifies for each remaining battery capacity whether or not each of the virtual hardware elements is provided to the virtual machine. In some embodiments, the remaining battery capacity that is used for the definition of the allocation rule may be the virtual remaining capacity or the physical remaining capacity. Specifically, in the third embodiment, the virtual remaining capacity is used, and in the fourth and fifth embodiments, the physical remaining capacity is used.

In FIG. 10, as the virtual hardware elements, the first to second cores of the CPU, the first to fourth cores of the GPU, the USB controller, and the WiFi module are illustrated. As a matter of course, although there may be other virtual hardware elements such as the display, the speaker, and the like, for ease of explanation, in FIG. 10, other hardware elements are collectively indicated as "other".

In the example of FIG. 10, the allocation of the memory is not explicitly indicated in both of the allocation rules 701 and 702. However, it is assumed that in the example of FIG. 10, it is implicitly predetermined that the memory may always be provided to any of the virtual machines regardless of the remaining battery capacity. In some embodiments, in order to change the memory capacity that is allocated to each of the virtual machines in accordance with the remaining battery capacity, one of the virtual hardware elements defined by the allocation rule may be the virtual memory module.

Further, due to space limitations, in FIG. 10, the USB controller is abbreviated as the "USB", and the WiFi module is abbreviated as the "WiFi". Since there is no risk of confusion, in FIG. 10 and explanations thereof, the virtual CPU is indicated simply as the "first core of the CPU", for example.

Also in FIG. 10, a mark "○" indicates that the hypervisor 320 provides the virtual hardware elements to the virtual machine. On the other hand, a mark "x" indicates that the hypervisor 320 does not provide the virtual hardware elements to the virtual machine.

The allocation rule 701 is the rule for the virtual machine 350a, for example, and the allocation rule 702 is the rule for the virtual machine 350b, for example.

According to the allocation rule 701, when the remaining battery capacity is not less than 30 Wh, the hypervisor 320 provides to the virtual machine 350a all of the virtual hardware elements of the following (28a) to (28f).
(28a) The first to second cores of the CPU
(28b) The first to fourth cores of the GPU
(28c) The USB controller
(28d) The WiFi module
(28e) The virtual hardware elements classified as "other"
(28f) The memory Further, according to the allocation rule 701, when the remaining battery capacity is not less than 10 Wh but is less than 30 Wh, the hypervisor 320 provides to the virtual machine 350a the virtual hardware elements of the following (29a) to (28e), but it does not provide the USB controller.
(29a) The first to second cores of the CPU
(29b) The first to fourth cores of the GPU
(29c) The USB controller
(29d) The WiFi module
(29e) The virtual hardware elements classified as "other"

According to the allocation rule 701, when the remaining battery capacity is not less than 1 Wh and is less than 10 Wh, the hypervisor 320 provides to the virtual machine 350a all of the virtual hardware elements of the following (30a) to (30d).
(30a) The first core of the CPU
(30b) The first to second cores of the GPU
(30c) The virtual hardware elements classified as "other"
(30d) The memory However, when the remaining battery capacity is not less than 1 Wh and is less than 10 Wh, the hypervisor 320 does not provide to the virtual machine 350a the virtual hardware elements of the following (31a) to (31d).
(31a) The second core of the CPU
(31b) The third to fourth cores of the GPU
(31c) The USB controller
(31d) The WiFi module When the remaining battery capacity is less than 1 Wh, according to the allocation rule 701, the hypervisor 320 provides to the virtual machine 350a the first core and the memory of the CPU, but does not provide any of the remaining virtual hardware elements.

According to the allocation rule 702, when the remaining battery capacity is not less than 30 Wh, the hypervisor 320 provides to the virtual machine 350b all of the virtual hardware elements of the following (32a) to (32f).
(32a) The first to second cores of the CPU
(32b) The first to fourth cores of the GPU
(32c) The USB controller
(32d) The WiFi module
(32e) The virtual hardware elements classified as "other"
(32f) The memory According to the allocation rule 702, when the remaining battery capacity is not less than 10 Wh but is less than 30 Wh, the hypervisor 320 provides to the virtual machine 350b the virtual hardware elements of the following (33a) to (33f), but it does not provide the second core of the CPU and third to fourth cores of the GPU.
(33a) The first core of the CPU
(33b) The first to second cores of the GPU
(33c) The USB controller
(33d) The WiFi module
(33e) The virtual hardware elements classified as "other"
(33f) The memory According to the allocation rule 702, when the remaining battery capacity is not less than 1 Wh but is less than 10 Wh, the hypervisor 320 provides to the virtual machine 350b the virtual hardware elements of the following (34a) to (34f), but it does not provide the second core of the CPU and the second to fourth cores of the GPU.
(34a) The first core of the CPU
(34b) The first core of the GPU
(34c) The USB controller
(34d) The WiFi module
(34e) The virtual hardware elements classified as "other"
(34f) The memory When the remaining battery capacity is less than 1 Wh, according to the allocation rule 702, the hypervisor 320 provides to the virtual machine 350b the first core of the CPU and the memory, but it does not provide any of the remaining virtual hardware elements.

When the allocation rules 701 and 702 are compared, the following two matters are found.

First, when the remaining battery capacity values (virtual remaining capacity values in the third embodiment and physical remaining capacity values in the fourth to fifth embodiments) that are reported to the OSs 351a and 351b are the same, virtual processor resources such as CPU cores or GPU cores tend to be allocated more to the virtual machine 350a. In other words, the virtual machine 350a is prioritized over the virtual machine 350b with regard to the virtual processor resources.

Second, in contrast, when the remaining battery capacity values that are reported to the OSs 351a and 351b are the same, virtual hardware resources (specifically, the USB controller and the WiFi module) other than the virtual processor resources tend to be allocated more to the virtual machine 350b. In other words, the virtual machine 350b is prioritized over the virtual machine 350a with regard to virtual hardware resources such as the USB controller or the WiFi module.

As mentioned above, in accordance with the types of virtual hardware elements, the virtual machine that is prioritized may differ. As a matter of course, an allocation rule may be decided such that "a certain virtual machine is prioritized over another virtual machine regardless of the types of the virtual hardware elements, when comparing the cases in which the remaining battery capacity values are the same".

Further, in the example of FIG. 10, the conditions of "not less than 30 Wh", "not less than 10 Wh but less than 30 Wh", "not less than 1 Wh but less than 10 Wh", and "less than 1 Wh" that are the same with regard to the remaining battery capacity are used in the allocation rules 701 and 702. However, the different conditions may be used in the allocation rules 701 and 702 with regard to the remaining battery capacity.

Next, in reference to the flowchart of FIG. 11, explanations are given for the processing that is performed by the hypervisor 320 in the third embodiment. The hypervisor 320 may commence the processing of FIG. 11 after completing the processing such as initialization for making the virtual machines 350a and 350b run, for example. The hypervisor 320 executes the processing of FIG. 11 in parallel with the other processing (e.g., a response to the hypervisor call).

In step S201, the hypervisor 320 initializes the index variable k by substituting 1 into the index variable k.

Next, in step S202, the hypervisor 320 acquires, from the calculation unit 343 of the virtual battery driver 340, the newest virtual remaining capacity value calculated by the calculation unit 343 with regard to the $k^{th}$ OS. The calculation unit 343 of the third embodiment stores the calculated virtual remaining capacity value $r_k$ in the memory 211, for example, in preparation for the request from the hypervisor 320.

Next, in step S203, the hypervisor 320 decides the configuration of the virtual hardware that is provided by the hypervisor 320 to the $k^{th}$ virtual machine in accordance with the virtual remaining capacity value $r_k$ and the allocation rule. The hypervisor 320 changes the configuration of the virtual hardware of the $k^{th}$ virtual machine in accordance with the decision, as appropriate.

For example, when the $k^{th}$ virtual machine is the virtual machine 350*a*, and when the virtual remaining capacity value $r_k$ is 15 Wh, the hypervisor 320 refers to the allocation rule 701 for the virtual machine 350*a*. Since 10≤15<30, the hypervisor 320 decides to provide the virtual hardware elements of the following (35a) to (35e) to the virtual machine 350*a*, and together with this, the hypervisor 320 decides not to provide the USB controller to the virtual machine 350*a*.

(35a) The first to second cores of the CPU
(35b) The first to fourth cores of the GPU
(35c) The WiFi module
(35d) The virtual hardware elements classified as "other"
(35e) The memory The hypervisor 320 changes the configuration of the virtual hardware that is provided to the virtual machine 350*a* in accordance with the decision, as appropriate.

For example, there may be a case in which the configuration of the virtual hardware that is provided by the hypervisor 320 currently to the virtual machine 350*a* is the same as the configuration that has been decided as mentioned above. In this case, the hypervisor 320 does not change the configuration of the virtual hardware.

Further, it may occur that some virtual hardware elements that have not been provided by the hypervisor 320 to the virtual machine 350*a* are included in the virtual hardware elements that have been decided to be provided to the virtual machine 350*a* as mentioned above, by the hypervisor 320.

In this case, the hypervisor 320 performs a hot-add of the virtual hardware elements. Namely, the hypervisor 320 starts providing the virtual hardware elements to the virtual machine 350*a*. It is possible that the above mentioned hot-add is performed when, for example, charging of the battery 311 is in progress.

For example, when the following two conditions (36a) and (36b) are both satisfied, the hypervisor 320 performs a hot-add of the third core of the GPU.

(36a) The hypervisor 320 does not currently provide the third core of the GPU to the virtual machine 350*a*.
(36b) The hypervisor 320 has decided to provide the third core of the GPU to the virtual machine 350*a*, in accordance with the allocation rule 701 as mentioned above.

On the other hand, it may occur that some virtual hardware elements that have been provided by the hypervisor 320 to the virtual machine 350*a* are included in the virtual hardware elements that have been decided to not be provided to the virtual machine 350*a* by the hypervisor 320, as mentioned above.

In this case, the hypervisor 320 performs a hot-remove of the virtual hardware elements. Namely, the hypervisor 320 stops providing the virtual hardware elements to the virtual machine 350*a*. It is possible that the above mentioned hot-remove will be performed when, for example, the user continues utilizing the information processing device 300 for a long period of time without charging the battery 311.

For example, when the following two conditions (37a) and (37b) are both satisfied, the hypervisor 320 performs a hot-remove of the USB controller.

(37a) The hypervisor 320 currently provides the USB controller to the virtual machine 350*a*.
(37b) The hypervisor 320 has decided not to provide the USB controller to the virtual machine 350*a*, in accordance with the allocation rule 701 as mentioned above.

In the meantime, the hypervisor 320 may further perform appropriate processing associated with the hot-remove, in accordance with the types of the virtual hardware elements. For example, the hypervisor 320 may save the data stored in the register in the physical CPU core that has been allocated to the virtual CPU core, before hot-removing the virtual CPU core.

As mentioned above, in step S203, the configuration of the virtual hardware of the $k^{th}$ virtual machine is changed, as appropriate, on the basis of the current configuration of the virtual hardware of the $k^{th}$ virtual machine, the allocation rule for the $k^{th}$ virtual machine, and the virtual remaining capacity value $r_k$.

In the next step S204, the hypervisor 320 compares the value of the index variable k and the number of the virtual machines N in the information processing device 300.

When k<N, the virtual machine for which the decision of whether or not to change the configuration of the virtual hardware has not been made remains. Accordingly, the processing of FIG. 11 moves from step S204 to step S205.

On the other hand, when k≥N (specifically, when k=N), the configurations of the virtual hardware for all of the virtual machines have been decided. Accordingly, the processing of FIG. 11 moves from step S204 to step S206.

In step S205, the hypervisor 320 increments the index variable k by 1. Then, the processing of FIG. 11 returns to step S202.

On the other hand, in step S206, the hypervisor 320 waits until a predetermined time period passes. When the predetermined time period has passed, the processing of FIG. 11 returns to step S201. Although the length of the predetermined time period is arbitrary, it is preferable that the prescribed time period not be shorter than the unit of time in step S102 of FIG. 6 to FIG. 7.

As explained so far above in reference to FIG. 11, in the third embodiment, the hypervisor 320 regularly monitors the virtual remaining capacity value with regard to each of the virtual machines and dynamically changes the configuration of the virtual hardware that is provided by the hypervisor 320 to each of the virtual machines, in accordance with the virtual remaining capacity value. Therefore, according to the third embodiment, even though each of the OSs on each of the virtual machines does not perform a power-saving control, as a result of the hot-remove, the electrical energy consumption is reduced. Consequently, for the information processing device 300 as a whole, the service life of the battery 311 is further prolonged.

Further, by utilizing the allocation rule in accordance with the use of the virtual machine, a well-balanced electrical energy use may be realized for the information processing device 300 as a whole. Different allocation rules may be applied to a virtual machine that is used for an application in which many of the processor resources are consumed and a virtual machine that is used for an application in which many of the communication resources are consumed. By applying the allocation rule in accordance with the use application of the virtual machine, the virtual hardware element that has a lower priority for the virtual machine is deleted early from each of the virtual machines. Namely, an allocation rule in accordance with the use application of the virtual machine may be used in order to have a good balance between maintaining convenience and a power-saving effect.

Next, explanations are given for the processing that is performed by the hypervisor 320 in the fourth to fifth embodiments, in reference to the flowchart of FIG. 12.

In step S301, the hypervisor 320 acquires from the battery I/F 203 the physical remaining capacity value R.

Next, in step S302, the hypervisor 320 initializes the index variable k by substituting 1 into the index variable k.

Next, in step S303, the hypervisor 320 decides the configuration of the virtual hardware that is provided by the hypervisor 320 to the $k^{th}$ virtual machine, in accordance with the physical remaining capacity value R and the allocation rule. Then, the hypervisor 320 changes the configuration of the virtual hardware of the $k^{th}$ virtual machine in accordance with the decision, as appropriate. Step S303 is similar to step S203 of FIG. 11 except that the physical remaining capacity value R is used instead of the virtual remaining capacity value $r_k$ in making a decision. Accordingly, detailed explanations are omitted.

In the next step S304, the hypervisor 320 compares the value of the index variable k with the number N of the virtual machines in the information processing device 300.

When k<N, the virtual machine for which the decision of whether or not to change the configuration of the virtual hardware has not been made remains. Accordingly, the processing of FIG. 12 moves from step S304 to step S305.

On the other hand, when k≥N (specifically, when k=N), the configurations of the virtual hardware for all of the virtual machines have been decided. Accordingly, the processing of FIG. 12 moves from step S304 to step S306.

In step S305, the hypervisor 320 increments the index variable k by 1. Then, the processing of FIG. 12 returns to step S303.

On the other hand, in step S306, the hypervisor 320 waits until a predetermined time period passes. When the predetermined time period has passed, the processing of FIG. 12 returns to step S301. Although the length of the predetermined time period is arbitrary, it is preferable that the prescribed time period not be shorter than the unit of time in step S102 of FIG. 6 to FIG. 7.

As explained so far above in reference to FIG. 12, in the fourth to fifth embodiments, the hypervisor 320 regularly monitors the physical remaining capacity of the battery 311 and dynamically changes the configuration of the virtual hardware that is provided by the hypervisor 320 to each of the virtual machines, in accordance with the physical remaining capacity of the battery 311. Therefore, according to the fourth to fifth embodiments, even though each of the OSs on each of the virtual machines does not perform a power-saving control, as a result of the hot-remove, the electrical energy consumption is reduced. Consequently, for the information processing device 300 as a whole, the service life of the battery 311 is further prolonged.

Further, in the fifth embodiment, although the virtual remaining capacity value is not used, the effect wherein the electrical energy is appropriately used for an information processing device as a whole even when a plurality of the OSs runs on the hypervisor is obtained in the fifth embodiment as well. Specifically, by utilizing the allocation rule in accordance with the use of the virtual machine, the above mentioned effect may be used. The reason is that the effect wherein a maintaining of convenience and a power-saving effect are well balanced due to utilizing the allocation rule in accordance with the use of the virtual machine that has been explained with regard to the third embodiment similarly applies to the fourth and fifth embodiments.

FIG. 13 explains the effect of the dynamic configuration change of the virtual hardware. Specifically, FIG. 13 illustrates the calculation example 801 with regard to the fourth comparative example in which the hypervisor 320 does not dynamically change the configuration of the virtual hardware and the calculation example 802 with regard to the fifth embodiment.

For the sake of simplifying the explanation, hereinafter, it is assumed that the electrical energy consumption of the information processing device 200 as a whole is approximated by the sum of the electrical energy consumption of the CPU 204, the GPU 205, and the WiFi module 216 of FIG. 2.

For the sake of simplifying the explanation, it is assumed that the OSs 351a and 351b do not perform any power-saving control. In other words, both of the OSs 351a and 351b follow the rule sets as described in the following (38a) to (38c).

(38a) Making all of the CPU cores run at a maximum frequency (for ease of explanation, it is assumed to be 1 GHz) that may be set in the CPU core, regardless of the remaining battery capacity.

(38b) Making all of the GPU cores run, regardless of the remaining battery capacity.

(38c) Communication volumes through the WiFi module are unlimited, regardless of the remaining battery capacity.

For the sake of simplifying the explanation, it is assumed that the dual-core physical CPU and the quad-core physical GPU are in the information processing device 300.

It is assumed that the first core of the physical CPU may be allocated to the first core of the virtual CPU for the virtual machine 350a and to the first core of the virtual CPU for the virtual machine 350b. Similarly, it is assumed that the second core of the physical CPU may be allocated to the second core of the virtual CPU for the virtual machine 350a and to the second core of the virtual CPU for the virtual machine 350b.

Similarly to the above, with regard to the GPU, it is assumed that the $m^{th}$ core of the physical CPU may be allocated to the $m^{th}$ core of the virtual GPU for the virtual machine 350a and to the $m^{th}$ core of the virtual CPU for the virtual machine 350b (m=1 to 4).

It is further assumed that the electrical energy for which each of the physical CPU cores runs at 1 GHz is 1 W. It is assumed that the electrical energy for which each of the physical GPU cores runs is 2 W. It is assumed that the electrical energy that is consumed by the physical CPU core during a certain period of time is proportional to the use rate of the physical CPU core during the certain period of time.

Symbols "t", "R", "$c_1$", and "$c_2$" in FIG. 13 are similar to FIG. 8 to FIG. 9. In FIG. 13, a timing at which the virtual hardware element is hot-removed is indicated by thick horizontal ruled lines.

In each of the tables of the calculation examples 801 and 802 of FIG. 13, "$u_1$" in the row of time t indicates the use rate of the physical CPU core resulting from the activities of the virtual machine 350a during the unit of time from time t to time (t+1). For the sake of simplifying the explanation, it is assumed that the use rate of any physical CPU core that is allocated to the virtual CPU core for the virtual machine 350a is the same rate $u_1$.

Similarly, "$u_2$" in the row of time t indicates the use rate of the physical CPU core resulting from the activities of the virtual machine 350b during the unit of time from time t to time (t+1). For the sake of simplifying the explanation, it is assumed that the use rate of any physical CPU core that is allocated to the virtual CPU core for the virtual machine 350*a* is the same rate $u_2$.

In the meantime, "$w_1$" in the row of time t indicates the average data rate during the time period from time t to time (t+1), in the communication that is performed through the virtual WiFi module of the virtual machine 350*a*. Similarly, "$w_2$" in the row of time t indicates the average data rate during the time period from time t to time (t+1), in the communication that is performed through the virtual WiFi module of the virtual machine 350*b*. All of the units of data rates $w_1$ and $w_2$ are [kB/h].

When the virtual WiFi module is hot-removed from the virtual machine 350*a*, as a matter of course, $w_1$=0. Similarly, when the virtual WiFi module is hot-removed from the virtual machine 350*b*, $w_2$=0.

For ease of explanation, it is assumed that the number of the virtual CPU cores provided by the hypervisor 320 to the virtual machine 350*a* at time t is "$n_1$". In addition, the number of the virtual GPU cores provided by the hypervisor 320 to the virtual machine 350*a* at time t is "$m_1$".

Similarly, it is assumed that the number of the virtual CPU cores provided by the hypervisor 320 to the virtual machine 350*b* at time t is "$n_2$". In addition, the number of the virtual GPU cores provided by the hypervisor 320 to the virtual machine 350*b* at time t is "$m_2$".

From the assumptions that have been explained above, the power $c_1$ and the power $c_2$ are indicated as expressions (10) and (11).

$$c_1 = 1 \cdot n_1 \cdot \frac{u_1}{100} + 2 \cdot m_1 + 0.01 \cdot w_1 \qquad (10)$$

$$c_2 = 1 \cdot n_2 \cdot \frac{u_2}{100} + 2 \cdot m_2 + 0.01 \cdot w_2 \qquad (11)$$

The electrical energy consumption in the unit of time from time t to time (t+1) may be indicated as "$(c_1+c_2) \times 1$". In each of the calculation examples 801 and 802, the physical remaining capacity value R at time (t+1) is the value that is obtained by subtracting the electrical energy consumption of "$(c_1+c_2) \times 1$" from the physical remaining capacity value R.

According to expression (10), as illustrated for example in each row of the calculation example 801, when $u_1$=50 and $w_1$=65 and $n_1$=2 and $m_1$=4, $c_1$=9.65. In addition, according to expression (11), as illustrated for example in each row of the calculation example 801, when $u_2$=25 and $w_2$=100 and $n_2$=2 and $m_2$=4, $c_2$=9.5.

The calculation example 801 is an example for the fourth comparison example in which the hypervisor 320 does not perform the hot-remove. Accordingly, in the calculation example 801, even when the physical remaining capacity value R decreases, a large electrical energy is used similarly to a case in which the physical remaining capacity value R is still large. Therefore, in the calculation example 801, the battery has already died at time where t=6.

On the other hand, in the calculation example 802 according to the fifth embodiment, the battery has not died at the time t=6 and accordingly, the battery 311 lasts for a longer time. Specifically, in the fifth embodiment, in accordance with a decrease in the physical remaining capacity value R, the virtual hardware element is dynamically deleted from the virtual machine 350*a*, and also, the virtual hardware element is dynamically deleted from the virtual machine 350*b*. Therefore, in the fifth embodiment, the electrical energy consumption of the information processing device 300 is smaller than the fourth comparison example due to the electrical energy consumption of the physical hardware element allocated to the virtual hardware element that is dynamically deleted. As a result, the battery 311 has a longer life as illustrated in FIG. 13.

For example, when the physical remaining capacity value R is not less than 10 Wh (specifically, in the row from t=0 to t=4 of the calculation example 802), $n_1$=2 and $m_1$=4 from the allocation rule 701. Therefore, in this case, according to the use rate $u_1$ and the data rate $w_1$ indicated in the calculation example 802, $c_1$=9.65.

However, when the physical remaining capacity value R is not less than 1 Wh but is less than 10 Wh (specifically, in the row of t=5 of the calculation example 802), $n_1$=1 and $m_1$=2 and $w_1$=0 from the allocation rule 701. Therefore, in this case, according to the use rate $u_1$ indicated in the calculation example 802, $c_1$=4.5.

When the physical remaining capacity value R is less than 1 Wh (specifically, in the row of t=6 of the calculation example 802), $n_1$=1 and $m_1$=0 and $w_1$=0 from the allocation rule 701. Therefore, in this case, according to the use rate $u_1$ indicated in the calculation example 802, $c_1$=0.5.

As mentioned above, in accordance with a decrease in the physical remaining capacity value R, the virtual hardware element is dynamically deleted from the virtual machine 350*a*, and the electrical energy for the execution of the virtual machine 350*a* is suppressed. The same applies to the virtual machine 350*b*.

For example, when the physical remaining capacity value R is not less than 30 Wh (specifically, in the row from t=0 to t=3 of the calculation example 802), $n_2$=2 and $m_2$=4 from the allocation rule 702. Therefore, in this case, according to the use rate $u_2$ and the data rate $w_2$ indicated in the calculation example 802, $c_2$=9.5.

When the physical remaining capacity value R is not less than 10 Wh but is less than 30 Wh (specifically, in the row from t=4 of the calculation example 802), $n_2$=1 and $m_2$=2 from the allocation rule 702. In this case, according to the use rate $u_2$ and the data rate $w_2$ indicated in the calculation example 802, $c_2$=5.25.

When the physical remaining capacity value R is not less than 1 Wh but is less than 10 Wh (specifically, in the row from t=5 of the calculation example 802), $n_2$=1 and $m_2$=1 from the allocation rule 702. In this case, according to the use rate $u_2$ and the data rate $w_2$ indicated in the calculation example 802, $c_2$=3.25.

When the physical remaining capacity value R is less than 1 Wh (specifically, in the row from t=6 of the calculation example 802), $n_2$=1 and $m_2$=0 and $w_2$=0 from the allocation rule 702. In this case, according to the use rate $u_2$ indicated in the calculation example 802, $c_2$=0.25.

As explained so far above in reference to FIG. 13, in the fifth embodiment, even though the OS does not perform power-saving control, the service life of the battery 311 is prolonged, and an availability time period of the information processing device 300 in the fifth embodiment is longer than that in the fourth comparative example. Further, in the fourth embodiment, in addition to the power-saving effect brought about by the hot-remove that is similar to the fifth embodiment, a power-saving effect brought about by each OS that performs the power-saving control may also be obtained. In the third embodiment, in addition to the power-saving effect that is similar to the fourth embodiment, the following effects (39a) to (39b), for example, may be obtained.

(39a) An appropriate electrical energy distribution for the information processing device 300 as a whole realized as the OS performs the power-saving control by using the virtual remaining capacity value instead of the virtual remaining capacity value.

(39b) A further power-saving effect as a result of the appropriate electrical energy distribution.

The present embodiments are not limited to the above mentioned first to fifth embodiments and the above mentioned embodiments may be modified in some way or another. Hereinafter, some points of view for modifying the above mentioned embodiments are illustrated. For example, the above mentioned embodiments may be modified in various ways from some of the viewpoints provided below and may arbitrarily be combined as long as no contradiction occurs.

In step S108 of FIG. 6, whether or not the physical remaining capacity value R is less than the threshold $D_p$ is judged. However, in some embodiments, whether or not the physical remaining capacity value R is not greater than the threshold $D_p$ may be judged. In step S117 of FIG. 7, whether or not the virtual remaining capacity value $r_k$ is less than the threshold $D_v$ is judged. However, in some embodiments, whether or not the virtual remaining capacity value $r_k$ is not greater than the threshold $D_v$ may be judged.

Further, specific values for each threshold may be determined appropriately and arbitrarily in accordance with the embodiments. Various numerical values illustrated in FIG. 4, FIG. 5A, FIG. 5B, FIG. 8 to FIG. 10, and FIG. 13 are merely illustrative values for ease of explanation.

As a matter of convenience, FIG. 4 to FIG. 5B illustrate various data in table form. However, formats for data are arbitrary in accordance with the embodiments. For example, the use status information 344 may be stored in a ring buffer. In addition, data formats that include a linear list, an associative array, a CSV (Comma Separated Values), and the like may also be available. In some embodiments, rule sets 500, 520, and 540 may be described in accordance with a specified mark-up language.

In addition, allocation rules 701 and 702 of FIG. 10 may be expressed by appropriate data formats in accordance with the embodiments.

Although mode information 346 is defined for each OS in the second embodiment, the modes of all of the OSs may be the same. When the mode of all of the OSs are the same, mode information 346 may be omitted.

As a matter of course, the mode information 346 may be present even when the modes of all of the OSs are the same. For example, when three modes are selectable, in accordance with the input from the user, the value that indicates one of the three modes may be stored in the non-volatile storage device 212 as mode information 346. In this case, the mode information 346 indicates a common mode to all of the OSs. Namely, the mode information 346 may be used not as characteristic information that indicates a characteristic for each OS but as information for specifying a method of calculation by using the calculation unit 343.

The number of selectable modes may be 3 as described in the second embodiment, or may be 2, or 4 or greater. For example, such embodiments are available in which only two from the first to third modes for which explanations have been given with regard to the second embodiment are selectable.

In contrast, embodiments in which a fourth mode is defined are also available. For example, the fourth mode may be that when the battery 311 is being charged, on the basis of the physical remaining capacity value R that has been acquired in step S107 and the virtual remaining capacity value $r_k$ that has been calculated in step S106, the calculation unit 343 re-calculates the virtual remaining capacity value. For example, the calculation unit 343 may calculate the maximum value, the minimum value, the average value, or the weighting sum of the physical remaining capacity value R and the provisionally calculated virtual remaining capacity value $r_k$ as the final virtual remaining capacity value $r_k$.

In the second embodiment, a method of calculation using the calculation unit 343 is variable in accordance with the mode information 346 and the flag 347. However, in some embodiments, the flag 347 may be omitted similarly to the mode information 346 that may be omitted in some embodiments, as mentioned above. For example, when the flag 347 is omitted, steps S113 to S114 of FIG. 6 may be omitted. Alternatively, when the flag 347 is omitted, in step S113 of FIG. 6, only whether or not the battery 311 is being charged may be judged, and when the battery 311 is being charged, step S114 may be executed.

Further, as illustrated in steps S108 to S112 of FIG. 6, in the case where a virtual remaining capacity value of zero is reported to each OS when the physical remaining capacity value R is less than the threshold $D_p$, steps S117 to S118 of FIG. 7 may be omitted. When steps S117 to S118 are omitted, processing moves on to step S119 after executing the calculation of step S116.

In contrast, in some embodiments, steps S108 to S112 of FIG. 6 may be omitted. Specifically, in the case where a virtual remaining capacity value of zero is reported when the virtual remaining capacity value $r_k$ is less than the threshold $D_v$, as is illustrated in steps S117 to S118 of FIG. 7, steps S108 to S112 may be omitted. When steps S108 to S112 are omitted, processing moves on to step S113 after the physical remaining capacity value R has been acquired in step S107.

The execution order of steps illustrated in the flowcharts of FIG. 6 to FIG. 7 may be appropriately changed as long as no contradiction occurs.

In the second embodiment, the profilers 341a, 341b, the acquisition unit 342, and the calculation unit 343 are implemented in the virtual battery driver 340. However, in some embodiments, some or all of the profilers 341a, 341b, the acquisition unit 342, and the calculation unit 343 may be implemented in the hypervisor 320.

Further, in the second embodiment, the profiler 341a is provided corresponding to the OS 351a, and the profiler 341b is provided corresponding to the OS 351b. However, in some embodiments, only one profiler may be provided and the one profiler may generate the use status information 344 on each OS and report to each OS the virtual remaining capacity value.

In the second embodiment, although one calculation unit 343 calculates the virtual remaining capacity value of each of the OSs, in some embodiments, another calculation unit may be provided for each OS. In this case, each of the plurality of the calculation units may calculate only the virtual remaining capacity value of the OS that corresponds to the calculation unit.

The profiler 341a of the second embodiment not only operates similarly to the first acquisition unit 105 of FIG. 1 but also operates similarly to the reporting unit 104. However, in some embodiments, the profiler 341a may be divided into a component that operates similarly to the first acquisition unit 105 and a component that operates similarly to the reporting unit 104. The profiler 341b may be divided similarly to the profiler 341a.

When the calculation unit 343 calculates the virtual remaining capacity value without using the use status information 344, the use status information 344 may be omitted.

In this case, the profilers 341a and 341b do not need to generate the use status information 344, either. In this case, steps S103 to S106 may also be omitted.

A commonality shared by the third to fifth embodiments is that the control is performed on the basis of the virtual remaining capacity value for any virtual machine or that the control is performed on the basis of the physical remaining capacity value for any virtual machine. However, for each of the virtual machines, this may be determined on the basis of which of the virtual remaining capacity value or the physical remaining capacity value the hypervisor changes the configuration of the virtual hardware of the virtual machine. For example, the hypervisor 320 may change the configuration of the virtual hardware of the virtual machine 350a on the basis of the virtual remaining capacity value $r_1$ that corresponds to the virtual machine 350a, while changing the configuration of the virtual hardware of the virtual machine 350b on the basis of the physical remaining capacity value R. Further, some virtual machines may be determined to not dynamically change the configuration of the virtual hardware.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device that is powered by a battery, the information processing device comprising:
    a processor that
        evaluates a virtual remaining capacity of the battery corresponding to each of a plurality of operating systems running on a hypervisor executed by the information processing device, by using characteristic information that indicates a characteristic of each of the plurality of operating systems and a physical remaining capacity value that indicates a physical remaining capacity of the battery, the characteristic information including priority information that indicates a priority of the each of the plurality of operating systems among the plurality of operating systems; and
        reports, to each individual operating system of the plurality of operating systems, a virtual remaining capacity value obtained by evaluating the virtual remaining capacity of the battery corresponding to the individual operating system.

2. The information processing device according to claim 1, wherein the characteristic information further includes
    use status information that indicates an amount of a resource used by the individual operating system and by an application that runs on the individual operating system.

3. The information processing device according to claim 2, wherein the virtual remaining capacity value monotonically increases with respect to the amount that is indicated by the use status information.

4. The information processing device according to claim 2, wherein the characteristic information includes the use status information that is associated with each of a plurality of time periods.

5. The information processing device according to claim 2, wherein the virtual remaining capacity value monotonically increases with respect to the priority that is indicated by the priority information.

6. The information processing device according to claim 1, wherein when the battery is being charged, the processor regards, for each individual operating system of at least one of the plurality of operating systems, the virtual remaining capacity value as a maximum value of a domain where the virtual remaining capacity value that corresponds to the individual operating system varies or a maximum value of a domain where the physical remaining capacity value varies.

7. The information processing device according to claim 1, wherein when the battery is being charged, the processor regards the physical remaining capacity value as a maximum value of a domain where the physical remaining capacity value varies and the processor evaluates the virtual remaining capacity value that corresponds to each of the plurality of operating systems by using the physical remaining capacity value regarded as the maximum value.

8. The information processing device according to claim 1, wherein when the battery is being charged, the processor regards the virtual remaining capacity value that corresponds to each of at least one of the plurality of operating systems as equal to the physical remaining capacity value.

9. The information processing device according to claim 1, wherein when the physical remaining capacity value is less than a first threshold, the processor regards the virtual remaining capacity value that corresponds to each of at least one of the plurality of operating systems as zero.

10. The information processing device according to claim 1, wherein when the virtual remaining capacity value that corresponds to a certain operating system of the plurality of operating systems is less than a second threshold, the processor re-evaluates the virtual remaining capacity value that corresponds to the certain operating system as zero.

11. The information processing device according to claim 1, wherein the hypervisor changes a configuration of virtual hardware provided by the hypervisor to each virtual machine which runs on the hypervisor and on which each of the plurality of operating systems runs, in accordance with at least the physical remaining capacity value or the virtual remaining capacity value corresponding to the operating system running on the virtual machine.

12. The information processing device according to claim 1, further comprising a display that displays a character, an image, or a combination thereof in accordance with the virtual remaining capacity value reported to at least one of the plurality of operating systems.

13. A method for reporting a remaining battery capacity, the method comprising:
    evaluating, by an information processing device that is powered by a battery and that executes a hypervisor, a virtual remaining capacity of the battery corresponding to each of a plurality of operating systems running on the hypervisor, by using characteristic information that indicates a characteristic of each of the plurality of operating systems and a physical remaining capacity value that indicates a physical remaining capacity of the battery, the characteristic information including priority information that indicates a priority of the each of the plurality of operating systems among the plurality of operating systems; and reporting, by the information processing device, to each individual operating system of the plurality of operating systems, a virtual remaining capacity value obtained by evaluating the virtual remaining capacity of the battery corresponding to the individual operating system.

14. The method according to claim 13, wherein a device driver for the battery runs on the hypervisor and the method is executed by the information processing device in a layer of the device driver.

* * * * *